United States Patent
Chang et al.

(10) Patent No.: US 11,600,529 B2
(45) Date of Patent: Mar. 7, 2023

(54) MULTI-GATE DEVICES AND METHOD OF FABRICATING THE SAME

(71) Applicant: Taiwan Semiconductor Manufacturing Company, Ltd., Hsinchu (TW)

(72) Inventors: Lo-Heng Chang, Hsinchu (TW); Chih-Hao Wang, Hsinchu County (TW); Kuo-Cheng Chiang, Hsinchu County (TW); Jung-Hung Chang, Changhua County (TW); Pei-Hsun Wang, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/718,342

(22) Filed: Apr. 12, 2022

(65) Prior Publication Data

US 2022/0238385 A1    Jul. 28, 2022

Related U.S. Application Data

(63) Continuation of application No. 16/805,832, filed on Mar. 2, 2020, now Pat. No. 11,322,409.

(Continued)

(51) Int. Cl.
*H01L 21/8234* (2006.01)
*H01L 29/08* (2006.01)
(Continued)

(52) U.S. Cl.
CPC .. *H01L 21/823431* (2013.01); *H01L 21/3086* (2013.01); *H01L 21/30604* (2013.01);
(Continued)

(58) Field of Classification Search
CPC ......... H01L 21/02603; H01L 21/28141; H01L 21/30604; H01L 21/3086; H01L 21/76224; H01L 21/823418; H01L 21/823431; H01L 21/823437; H01L 21/823468; H01L 21/823481; H01L 21/823821; H01L 21/845; H01L 27/0886; H01L 27/0924; H01L 27/10879; H01L 27/1211; H01L 29/0653; H01L 29/0665; H01L 29/0669;
(Continued)

(56) References Cited

U.S. PATENT DOCUMENTS 10,332,881 B1 * 6/2019 Badaroglu ........ H01L 21/02381
11,322,409 B2 * 5/2022 Chang ............... H01L 29/66439
(Continued)

*Primary Examiner* — David C Spalla
(74) *Attorney, Agent, or Firm* — JCIPRNET

(57) ABSTRACT

Provided is a semiconductor device including a semiconductor substrate, a plurality of semiconductor nanosheets, a plurality of source/drain (S/D) features and a gate stack. The semiconductor substrate includes a first fin and a second fin. The first fin has a first width less than a second width of the second fin, and a top surface of the first fin is lower than a top surface of the second fin. The plurality of semiconductor nanosheets are disposed on the first fin and the second fin. The plurality of source/drain (S/D) features are located on the first fin and the second fin and abutting the plurality of semiconductor nanosheets. The gate stack wraps each of the plurality of semiconductor nanosheets.

20 Claims, 39 Drawing Sheets

Related U.S. Application Data

(60) Provisional application No. 62/906,118, filed on Sep. 26, 2019.

(51) Int. Cl.
| | | |
|---|---|---|
| *H01L 29/66* | (2006.01) | |
| *H01L 21/306* | (2006.01) | |
| *H01L 21/308* | (2006.01) | |
| *H01L 29/423* | (2006.01) | |
| *H01L 27/088* | (2006.01) | |
| *H01L 21/762* | (2006.01) | |
| *H01L 29/10* | (2006.01) | |
| *H01L 29/06* | (2006.01) | |

(52) U.S. Cl.
CPC ............ *H01L 21/76224* (2013.01); *H01L 21/823418* (2013.01); *H01L 21/823437* (2013.01); *H01L 21/823468* (2013.01); *H01L 21/823481* (2013.01); *H01L 27/0886* (2013.01); *H01L 29/0673* (2013.01); *H01L 29/0847* (2013.01); *H01L 29/1037* (2013.01); *H01L 29/42392* (2013.01); *H01L 29/6653* (2013.01); *H01L 29/6656* (2013.01); *H01L 29/66545* (2013.01); *H01L 29/66553* (2013.01); *H01L 29/66636* (2013.01)

(58) Field of Classification Search
CPC ............ H01L 29/0673; H01L 29/0847; H01L 29/1037; H01L 29/41791; H01L 29/42392; H01L 29/6439; H01L 29/6653; H01L 29/66545; H01L 29/66553; H01L 29/6656; H01L 29/66636; H01L 29/66795; H01L 29/775; H01L 29/785; H01L 29/7851; H01L 29/7853; H01L 29/7855; H01L 2029/7858
See application file for complete search history.

(56) References Cited

U.S. PATENT DOCUMENTS

| | | | | |
|---|---|---|---|---|
| 2018/0308852 | A1* | 10/2018 | Lee | H01L 21/30604 |
| 2019/0214473 | A1* | 7/2019 | Xie | H01L 27/0886 |
| 2020/0006478 | A1* | 1/2020 | Hsu | H01L 21/823468 |
| 2020/0328123 | A1* | 10/2020 | Liu | B82Y 10/00 |

* cited by examiner

MULTI-GATE DEVICES AND METHOD OF FABRICATING THE SAME

CROSS-REFERENCE TO RELATED APPLICATION

This application is a continuation application of and claims the priority benefit of a prior application Ser. No. 16/805,832, filed on Mar. 2, 2020. The prior application Ser. No. 16/805,832 is an application of and claims the priority benefit of U.S. Provisional application Ser. No. 62/906,118, filed on Sep. 26, 2019. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate devices have been introduced in an effort to improve gate control by increasing gate-channel coupling, reduce OFF-state current, and reduce short-channel effects (SCEs). One such multi-gate device that has been introduced is the gate-all-around transistor (GAA). The GAA device gets its name from the gate structure which can extend around the channel region providing access to the channel on two or four sides. The GAA devices are compatible with conventional complementary metal-oxide-semiconductor (CMOS) processes and their structure allows them to be aggressively scaled while maintaining gate control and mitigating SCEs. In conventional processes, the GAA devices provide a channel in a stacked nanosheet configuration. Integration of fabricating the GAA features around stacked nanosheets can be challenging.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 6A to 15A illustrates a three-dimensional perspective view of an example semiconductor device at other various stages of fabrication in accordance with some embodiments of the present disclosure.

FIGS. 6B to 15B are fragmentary cross-sectional views along the I-I' line of the semiconductor device in FIGS. 6A to 15A at other various stages of fabrication according to some embodiments of the present disclosure.

FIGS. 6C to 15C are fragmentary cross-sectional views along the II-II' line of the semiconductor devices in FIGS. 6A to 15A at other various stages of fabrication according to some embodiments of the present disclosure.

DETAILED DESCRIPTION

Figure 1A:
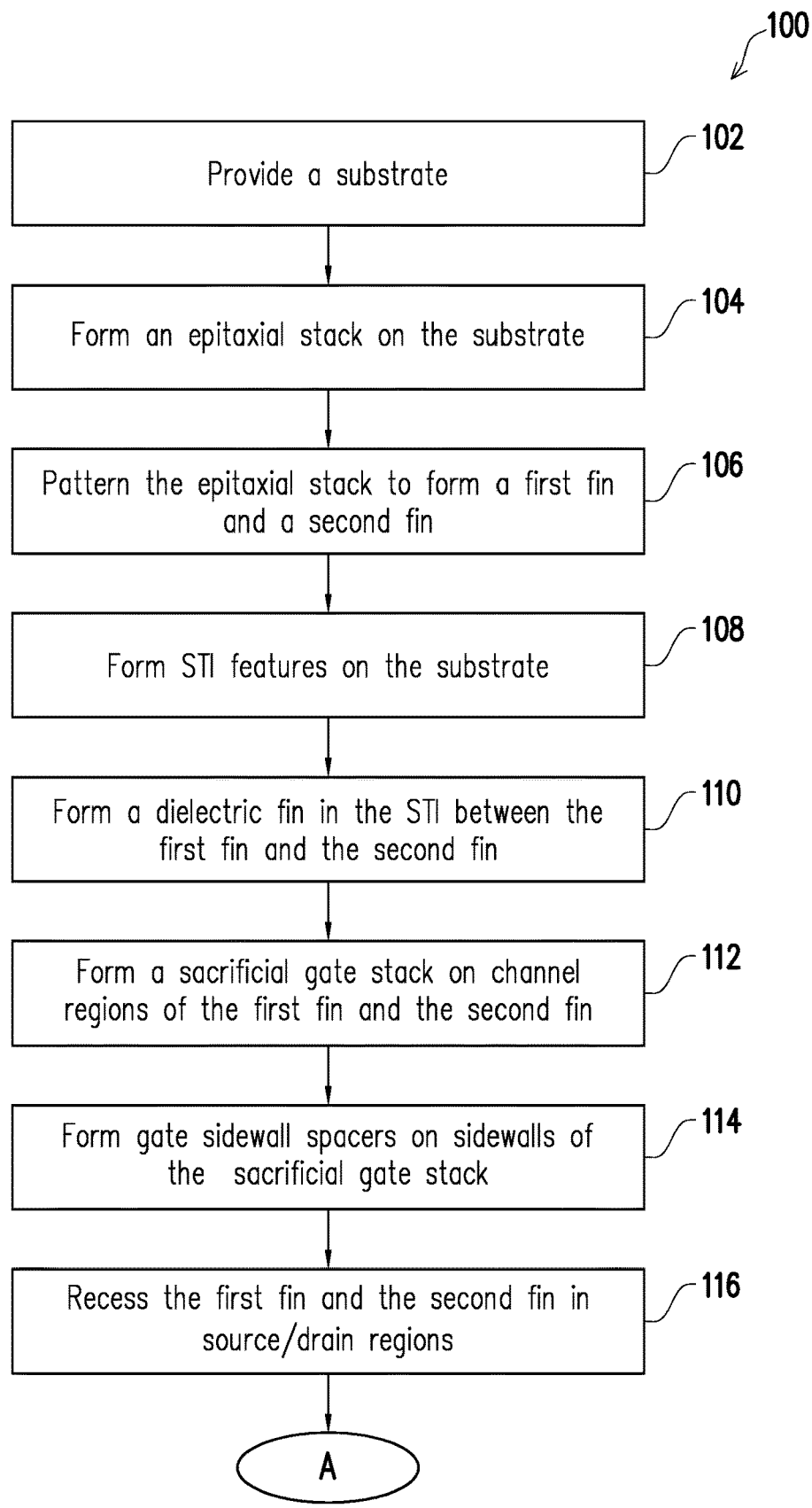
FIGS. 1A and 1B illustrate a flow chart of a method 100 for forming multi-gate devices according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to multi-gate transistors. Multi-gate transistors include those transistors whose gate structures are formed on at least two-sides of a channel region. These multi-gate devices may include a p-type metal-oxide-semiconductor device or an n-type metal-oxide-semiconductor multi-gate device. Specific examples may be presented and referred to herein as FINFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels. One of ordinary skill may recognize other examples of semiconductor devices that may benefit from aspects of the present disclosure.

Conventionally in a GAA process flow, epitaxial S/D features and a gate stack are separated by inner spacers. The inner spacers are formed by dielectric material deposition and an etch process to fill in cavities formed in epitaxial stack. However, inner spacer residues remain on fine-sized fins during the formation of the inner spacers, thereby blocking surfaces of the fins in source/drain spaces. As a result, epitaxial S/D features cannot grow from the surface of the fins, and therefore have more merge defects and poor quality. The present disclosure is to remove the inner spacer residue so as to provide high quality epitaxial S/D features.

Figure 1B:
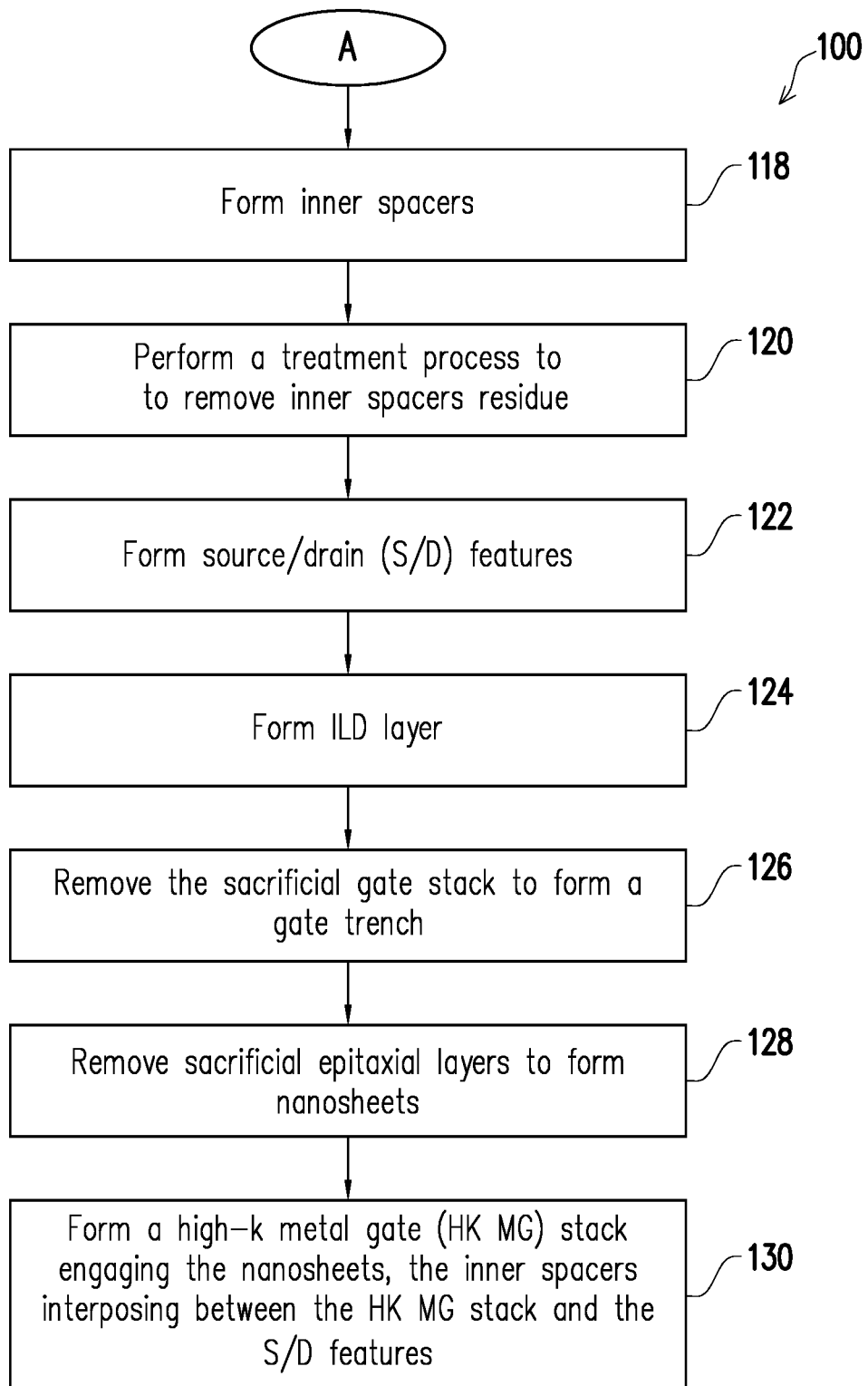

FIGS. 1A and 1B illustrate a flow chart of a method 100 for forming multi-gate devices according to various aspects of the present disclosure. As used herein, the term "multi-gate device" is used to describe a device (e.g., a semiconductor transistor) that has at least some gate material disposed on multiple sides of at least one channel of the device. In some examples, the multi-gate device may be referred to as a GAA device having gate material disposed on four sides of at least one channel member of the device. The channel member may be referred to as "nanosheet" or "semiconductor nanosheet," which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section.

FIGS. 1A and 1B will be described below in conjunction with FIGS. 2 to 15C. FIGS. 2 to 5 are fragmentary cross-sectional views of a semiconductor device 200 at various stages of fabrication according to some embodiments of method 100. FIGS. 6A to 15A are diagrammatic perspective views of a semiconductor device 200 at other various stages of fabrication according to some embodiments of the method 100. FIGS. 6B to 15B are fragmentary cross-sectional views along the I-I' line of the semiconductor devices 200 in FIGS. 6A to 15A at other various stages of fabrication according to some embodiments of the method 100. FIGS. 6C to 15C are fragmentary cross-sectional views along the II-II' line of the semiconductor devices 200 in FIGS. 6A to 15A at other various stages of fabrication according to some embodiments of the method 100. FIGS. 11D and 12D/12E are fragmentary cross-sectional views along the II-II' line of the semiconductor devices 200 in FIGS. 11A and 12A at other various stages of fabrication according to alternative embodiments of the method 100. The method 100 is merely an example, and is not intended to limit the present disclosure beyond what is explicitly recited in the claims. Additional steps may be provided before, during, and after method 100, and some of the steps described can be moved, replaced, or eliminated for additional embodiments of method 100. Additional features may be added in the semiconductor device depicted in FIGS. 2 to 15C and some of the features described below can be replaced, modified, or eliminated in other embodiments of the semiconductor device.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-15C, as with the remainder of the method and exemplary figures provided in this disclosure, are merely exemplary and are not intended to be limiting beyond what is specifically recited in the claims that follow.

Figure 2:
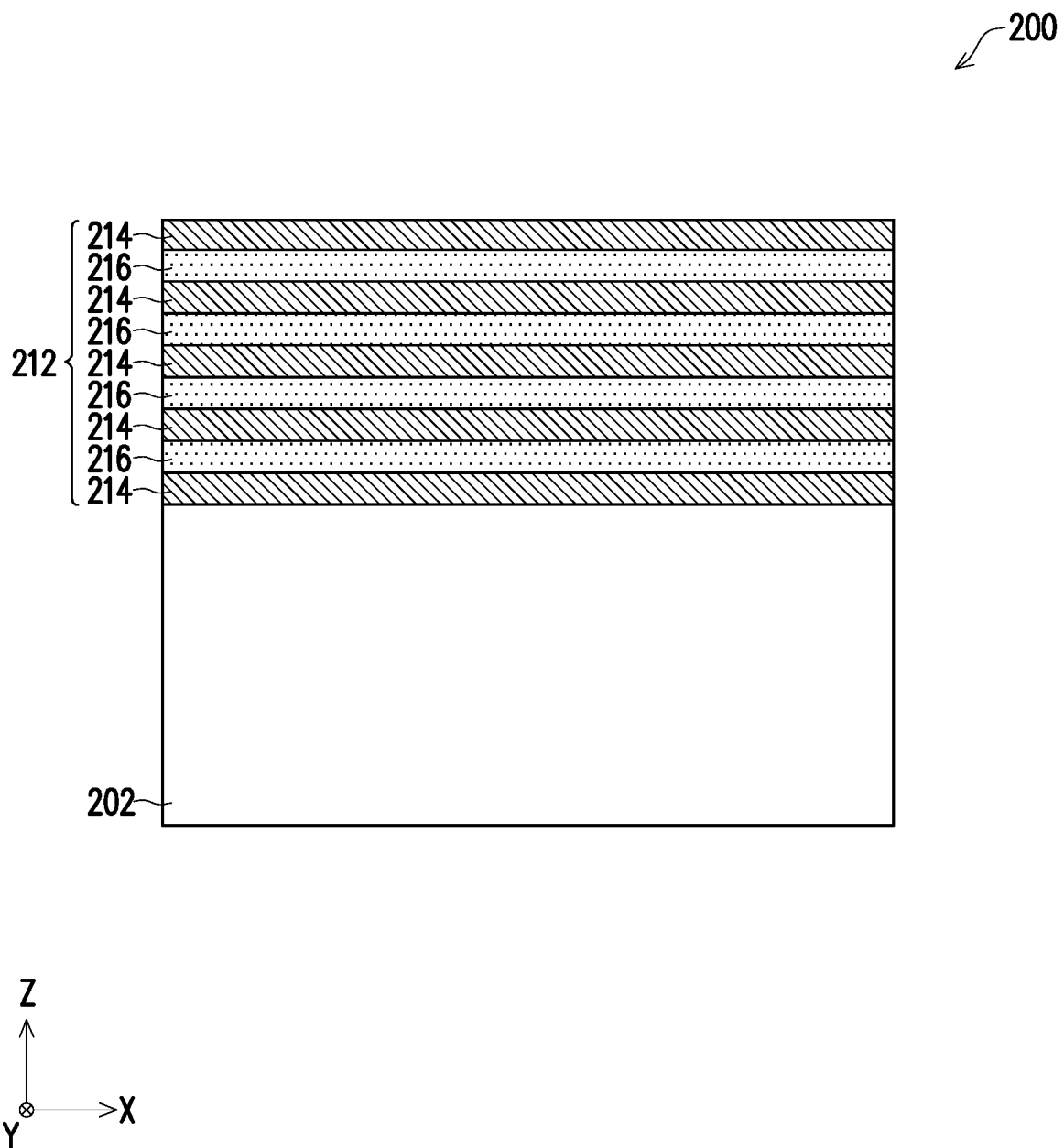
FIGS. 2 to 5 are fragmentary cross-sectional views of an example semiconductor device at various stages of fabrication in accordance with some embodiments of the present disclosure.

At operation 102, the method 100 (FIG. 1A) provides a substrate 202, as shown in FIG. 2. In some embodiments, the substrate 202 may be a semiconductor substrate such as a silicon (Si) substrate. The substrate 202 may include various layers, including conductive or insulating layers formed on a semiconductor substrate. The substrate 202 may include various doping configurations depending on design requirements as is known in the art. For example, different doping profiles (e.g., p-well, n-well) may be formed on the substrate 202 in regions designed for different device types (e.g., n-type field effect transistors (NFET), p-type field effect transistors (PFET)). The suitable doping may include ion implantation of dopants and/or diffusion processes, such as boron (B) for the p-well and phosphorous (P) for the n-well. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. In the illustrated embodiment, the substrate 202 is made of crystalline Si.

At operation 104, the method 100 (FIG. 1A) forms one or more epitaxial layers over the substrate 202, as shown in FIG. 2. In some embodiments, an epitaxial stack 212 is formed over the substrate 202. The epitaxial stack 212 includes epitaxial layers 214 of a first composition interposed by epitaxial layers 216 of a second composition. The first and second composition may be different. In an embodiment, the epitaxial layers 214 are SiGe and the epitaxial layers 216 are silicon. However, other embodiments are possible including those that provide for a first composition and a second composition having different oxidation rates and/or etch selectivity. In some embodiments, the epitaxial layer 214 includes SiGe and where the epitaxial layer 216 includes silicon, the silicon oxidation rate is less than the SiGe oxidation rate. It is noted that five (5) layers of epitaxial layers 214 and four (4) layers of epitaxial layers 216 are illustrated in FIG. 2, which is for illustrative purposes only and not intended to be limiting beyond what is specifically recited in the claims. It can be appreciated that any number of epitaxial layers may be formed in the epitaxial stack 212; the number of layers depending on the desired number of channels regions for the device 200. In some embodiments, the number of epitaxial layers 216 is between 2 and 10, such as 4 or 5.

In some embodiments, the epitaxial layer 214 has a thickness ranging from about 5 nm to about 15 nm. The epitaxial layers 214 may be substantially uniform in thickness. In some embodiments, the epitaxial layer 216 has a thickness ranging from about 5 nm to about 15 nm. In some embodiments, the epitaxial layers 216 of the stack are substantially uniform in thickness. As described in more detail below, the epitaxial layer 216 may serve as channel region(s) for a subsequently-formed multi-gate device and its thickness chosen based on device performance considerations. The epitaxial layer 214 may serve to define a gap between adjacent channel region(s) for a subsequently-formed multi-gate device and its thickness chosen based on device performance considerations.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 216 include the same material as the substrate 202. In some embodiments, the epitaxially grown layers 214 and 216 include a different material than the substrate 202. As stated above, in at least some examples, the epitaxial layer 214 includes an epitaxially grown $Si_{1-x}Ge_x$ layer (e.g., x is about 10~55%) and the epitaxial layer 216 includes an epitaxially grown silicon (Si) layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation, etch selectivity properties. In various embodiments, the epitaxial layers 214 and 216 are substantially dopant-free (i.e., having an extrinsic dopant concentration from about 0 $cm^{-3}$ to about $1\times10^{17}$ $cm^{-3}$), where for example, no intentional doping is performed during the epitaxial growth process. In the illustrated embodiment, the bottom layer and the top layer of the epitaxial stack 212 are SiGe layers. In alternative embodiments, the bottom layer of the epitaxial stack 212 is a Si layer and the top layer of the epitaxial stack 212 is a SiGe layer (not shown).

At operation 106, the method 100 (FIG. 1A) patterns the epitaxial stack 212 to form semiconductor fins 220 (also referred to as fins 220), as shown in FIG. 6. In various embodiments, each of the fins 220 includes an upper portion of the interleaved epitaxial layers 214 and 216, and a bottom portion protruding from the substrate 202. In some embodiments, the operation 106 includes forming a mask layer 218 over the epitaxial stack 212. The mask layer 218 includes a first mask layer $218_1$ and a second mask layer $218_2$. The first mask layer $218_1$ is a pad oxide layer made of a silicon oxide, which may be formed by a thermal oxidation. The second mask layer $218_2$ is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 218 is patterned into a mask pattern by using patterning operations including photo-lithography and etching.

Figure 3:
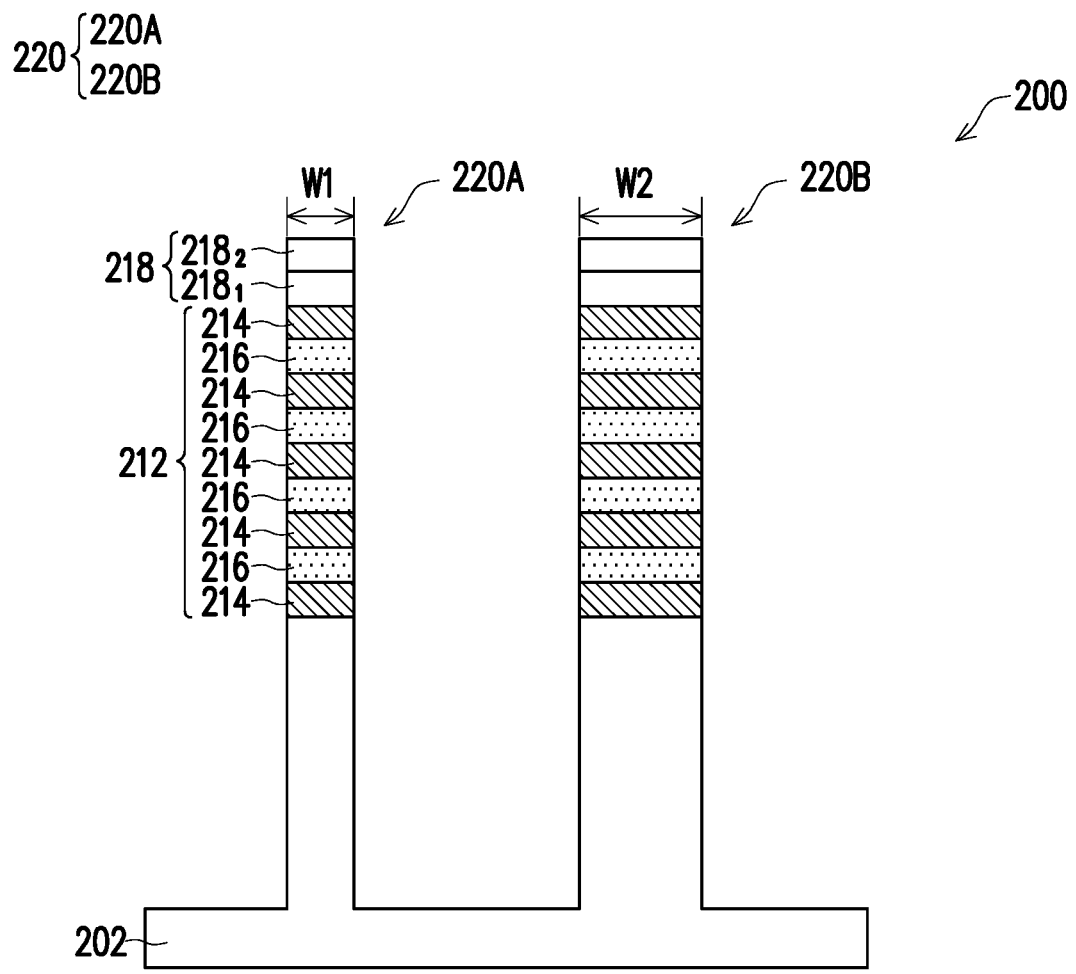

Operation 106 subsequently patterns the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into the fins 220 with trenches between adjacent fins 220. The fins 220 may include a fin 220A and a fin 220B having different widths. In some embodiments, the top width W1 of the fin 220A is in a range from about 6 nm to about 10 nm, while the top width W2 of the fin 220B is in a range from about 16 nm to about 20 nm. Each of the fin 220A and the fin 220B protrudes upwardly in the z-direction from the substrate 202 and extends lengthwise in the y-direction. Sidewalls of the fins 220A and 220B may be straight or inclined (not shown). In FIG. 3, two fins 220 (including one fin 220A and one fin 220B) are spaced apart along the x-direction. But the number of the fins is not limited to two, and may be as small as one or more than two.

Figure 4:
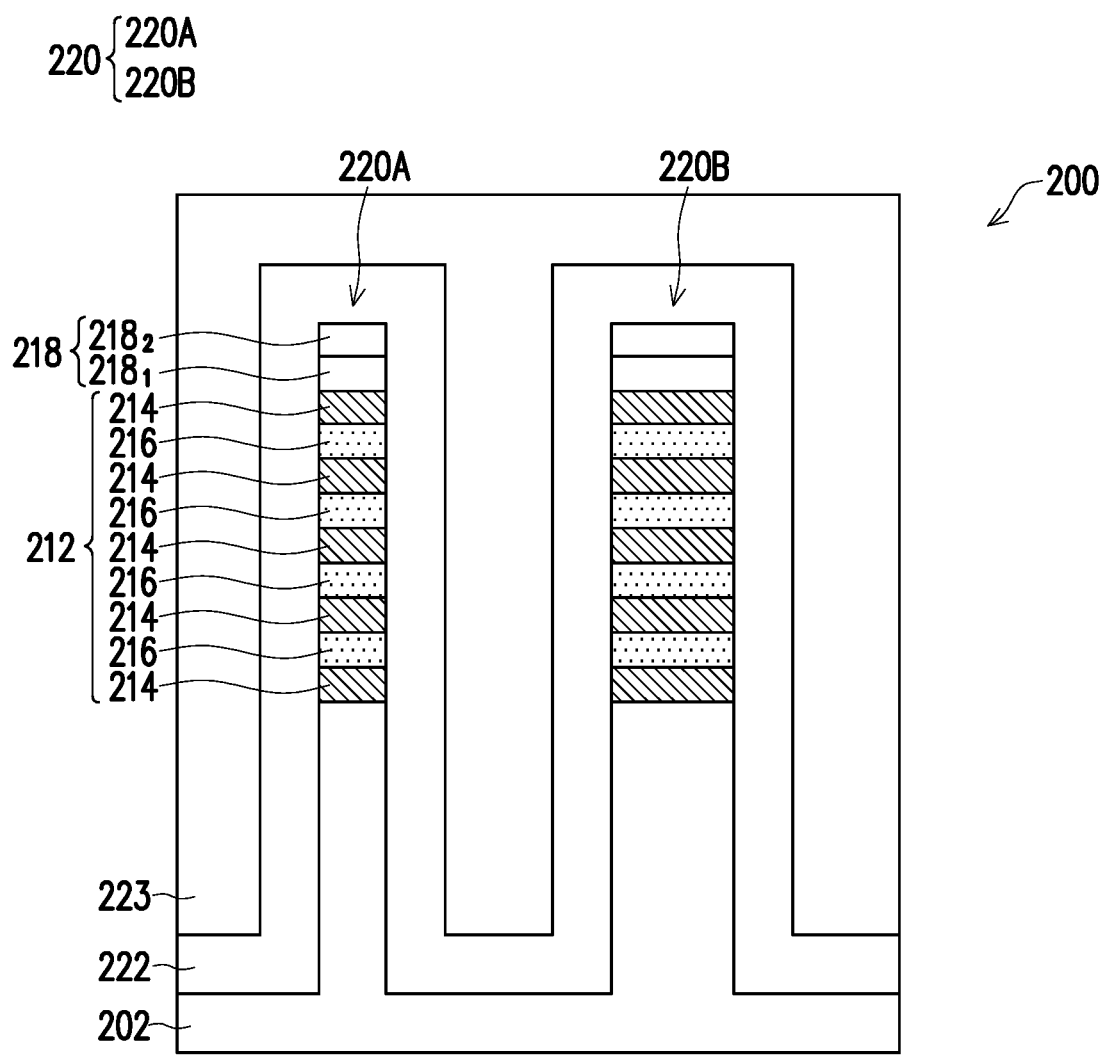

At operation 108, the method 100 (FIG. 1A) fills the trenches between adjacent fins 220 with a dielectric layer 222 and an insulating layer 223 to cover top surfaces and sidewalls of the fins 220, as shown in FIG. 4. The dielectric layer 222 may include one or more dielectric materials. Suitable dielectric materials for the dielectric layer 222 may include silicon oxides, silicon nitrides, silicon carbides, fluorosilicate glass (FSG), low-K dielectric materials, and/or other suitable dielectric materials. The dielectric material may be deposited by any suitable technique including thermal growth, flowable CVD (FCVD), HDP-CVD, PVD, ALD, and/or spin-on techniques. The insulating layer 223 and the dielectric layer 222 have different materials. Suitable insulating materials for the insulating layer 223 may include silicon oxides, silicon nitrides, silicon carbides, fluorosilicate glass (FSG), low-k dielectric materials, and/or other suitable dielectric materials. The insulating layer 223 material may be deposited by any suitable technique including thermal growth, FCVD, HDP-CVD, PVD, ALD, and/or spin-on techniques. In the illustrated embodiment, the dielectric layer 222 includes silicon oxide, and an insulating layer 223 includes silicon nitride.

Figure 5:
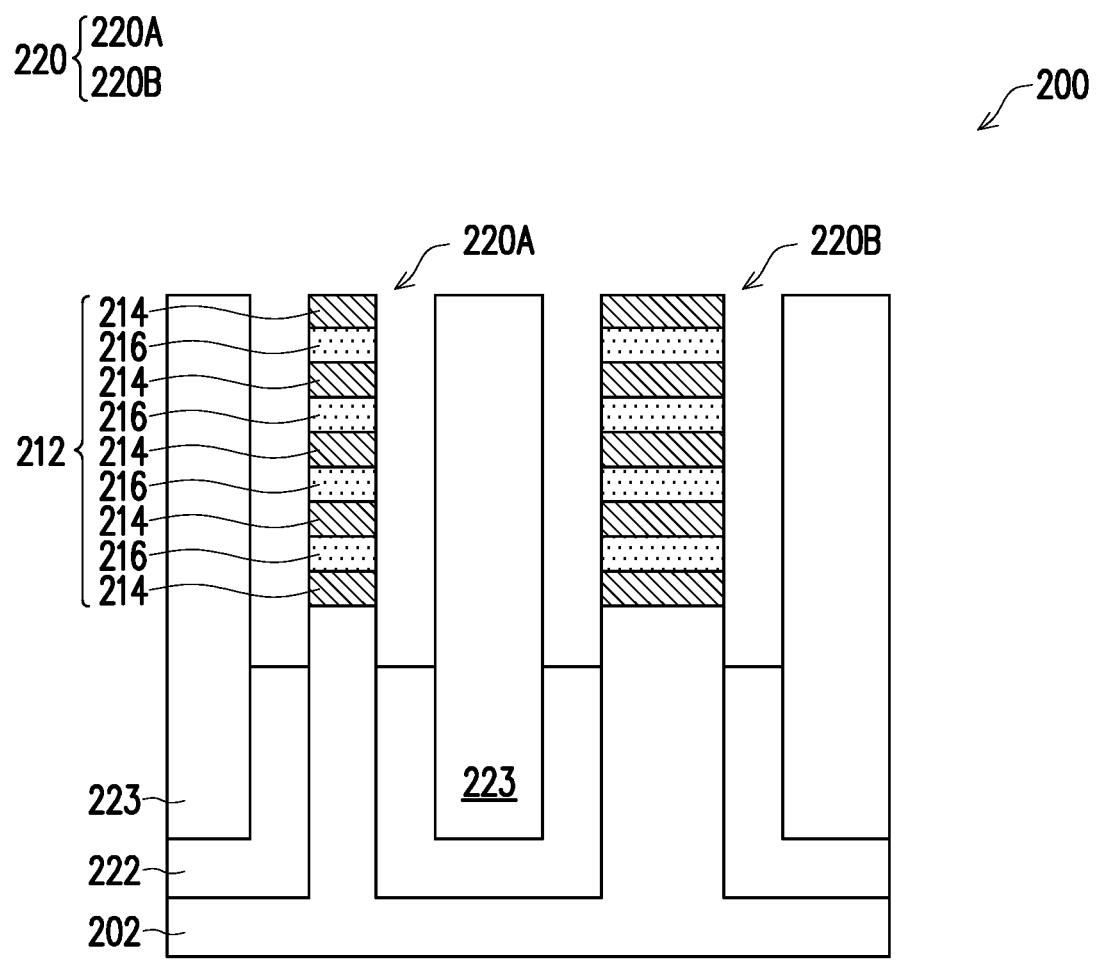

Operation 110 subsequently planarizes the insulating layer 223 and the dielectric layer 222 by using, for example, CMP, until top surfaces of the mask layer 218 are revealed, and recesses the dielectric layer 222 to form shallow trench isolation (STI) features (also denoted as STI features 222) and dielectric fins 223, as shown in FIG. 5. In the illustrated embodiment, the STI features 222 are formed on the substrate 202, while the dielectric fins 223 are formed within the STI features 222, and bottom portions of the dielectric fins 223 are surrounded by the STI features 222. A top surface of the hybrid fin 223 may be higher than a top surface of the STI feature 222 as illustrated in FIG. 5. Each of the hybrid fin 223 protrudes upwardly in the z-direction from the STI feature 222 and extends lengthwise in the y-direction. The dielectric fins 223 and the fins 220 are spaced apart and alternately disposed along the x-direction. Any suitable etching technique may be used to recess the isolation features 222 including dry etching, wet etching, RIE, and/or other etching methods, and in an exemplary embodiment, an anisotropic dry etching is used to selectively remove the dielectric material of the isolation features 222 without etching the fins 220 and the hybrid fin 223. The mask layer 218 (shown in FIG. 4) may also be removed before, during, and/or after the recessing of the isolation features 222. In some embodiments, the mask layer 218 is removed by the CMP process performed prior to the recessing of the isolation features 222. In some embodiments, the mask layer 218 is removed by an etchant used to recess the isolation features 222.

Figure 6A:
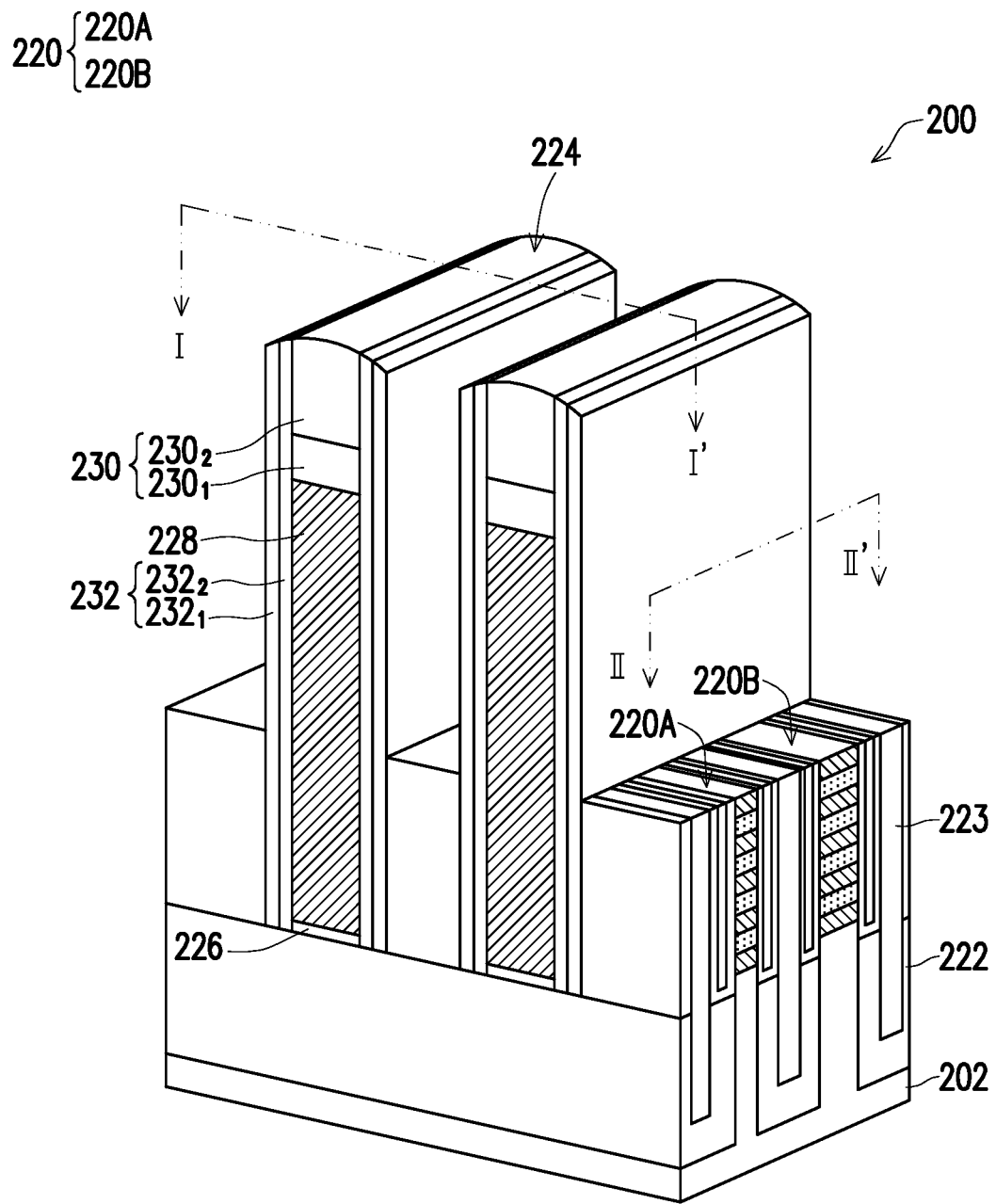
Figure 6B:
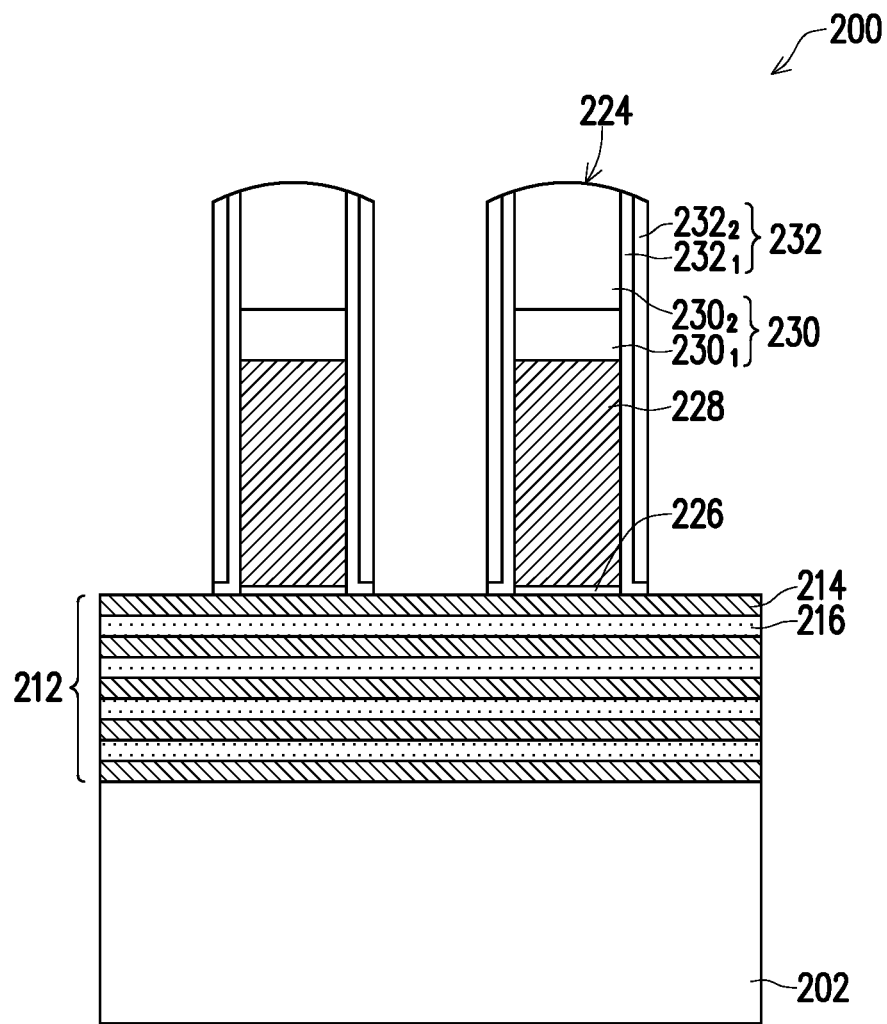
Figure 6C:
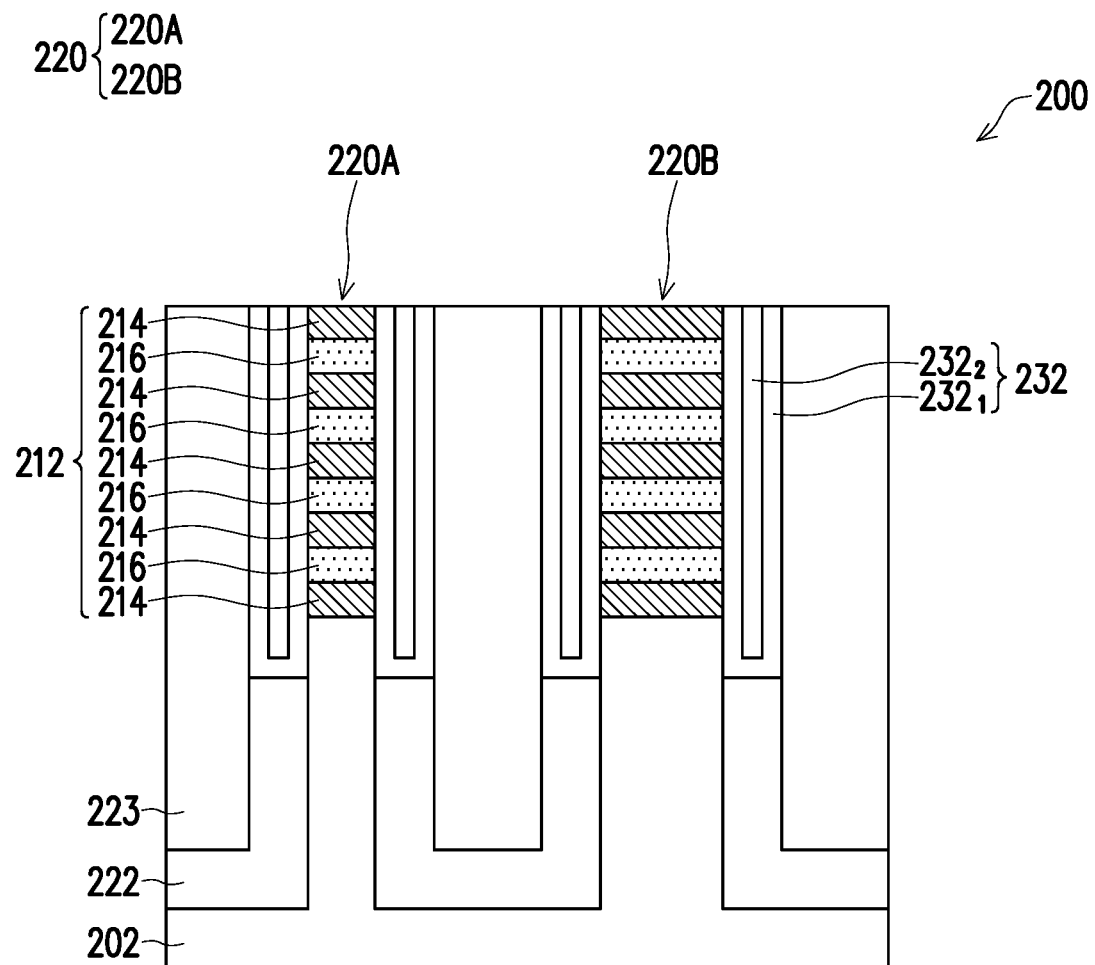

At operation 112, the method 100 (FIG. 1A) forms a sacrificial (dummy) gate structure 224, as shown in FIGS. 6A, 6B and 6C, where FIG. 6B is a cross-sectional view along I-I' line of the device 200 in FIG. 6A, and FIG. 6C is a cross-sectional view along II-II' line of the device 200 in FIG. 6A. The sacrificial gate structures 224 are formed over portions of the fin 220A and the fin 220B which are to be channel regions. The sacrificial gate structures 224 define the channel regions of the GAA devices. Each of the sacrificial gate structures 224 includes a sacrificial gate dielectric layer 226 and a sacrificial gate electrode layer 228 over the sacrificial gate dielectric layer 226. The sacrificial gate structures 224 are formed by first blanket depositing the sacrificial gate dielectric layer 226 over the fins 220. A sacrificial gate electrode layer 228 is then blanket deposited on the sacrificial gate dielectric layer 226 and over the fins 220. The sacrificial gate electrode layer 228 includes silicon such as polycrystalline silicon or amorphous silicon. The thickness of the sacrificial gate dielectric layer 226 is in a range from about 1 nm to about 5 nm in some embodiments. The thickness of the sacrificial gate electrode layer 228 is in a range from about 100 nm to about 200 nm in some embodiments. In some embodiments, the sacrificial gate electrode layer is subjected to a planarization operation. The sacrificial gate dielectric layer 226 and the sacrificial gate electrode layer 228 are deposited using CVD, including LPCVD and PECVD, PVD, ALD, or other suitable process. Subsequently, a mask layer 230 is formed over the sacrificial gate electrode layer. The mask layer 230 may include a silicon oxynitride layer $230_1$ and a silicon nitride mask layer $230_2$ having a thickness, for example, ranging from about 10 nm to about 30 nm and ranging from about 50 nm to about 70 nm, respectively. Subsequently, a patterning operation is performed on the mask layer 230 and sacrificial gate dielectric and electrode layers are patterned into the sacrificial gate structures 224. By patterning the sacrificial gate structures 224, the fins 220 are partially exposed on opposite sides of the sacrificial gate structures 224, thereby defining source/drain (S/D) regions. In this disclosure, a source and a drain are interchangeably used and the structures thereof are substantially the same.

At operation 114, the method 100 (FIG. 1A) forms spacers 232 on sidewalls of the sacrificial gate structure 224 and sidewalls of the fin 220A and the fin 220B, as shown in FIGS. 6A, 6B and 6C. The spacers 232 may include a dielectric material such as silicon oxide, silicon nitride, silicon carbide, silicon oxynitride, SiCN films, silicon oxycarbide, SiOCN films, and/or combinations thereof. In some embodiments, the spacers 232 include multiple layers, such as liner layers $232_1$ and main spacer walls $232_2$. By way of example, the gate sidewall spacers 232 may be formed by depositing a liner material layer and a dielectric material layer over the sacrificial gate structure 224 using processes such as, a subatmospheric CVD (SACVD) process, a flowable CVD process, an ALD process, a PVD process, or other suitable process respectively, as shown in FIG. 6A. In some embodiments, the deposition of the liner material layer and the dielectric material layer are followed by an etching-back (e.g., anisotropically) process to expose portions of the fin 220A and the fin 220B adjacent to and not covered by the sacrificial gate structure 224 (e.g., S/D regions). The liner material layer and the dielectric material layer may remain on the sidewalls of the sacrificial gate structure 224 as gate sidewall spacers, and on the sidewalls of the fin 220A and the fin 220B as fin sidewall spacers. In some embodiments, the etching-back process may include a wet etch process, a dry etch process, a multiple-step etch process, and/or a combination thereof. The spacers 232 may have a thickness ranging from about 5 nm to about 20 nm, and the liner layers $232_1$ and the main spacer walls $232_2$ may have a thickness ranging, for example, from about 2.5 nm to about 10 nm, respectively.

Figure 7A:
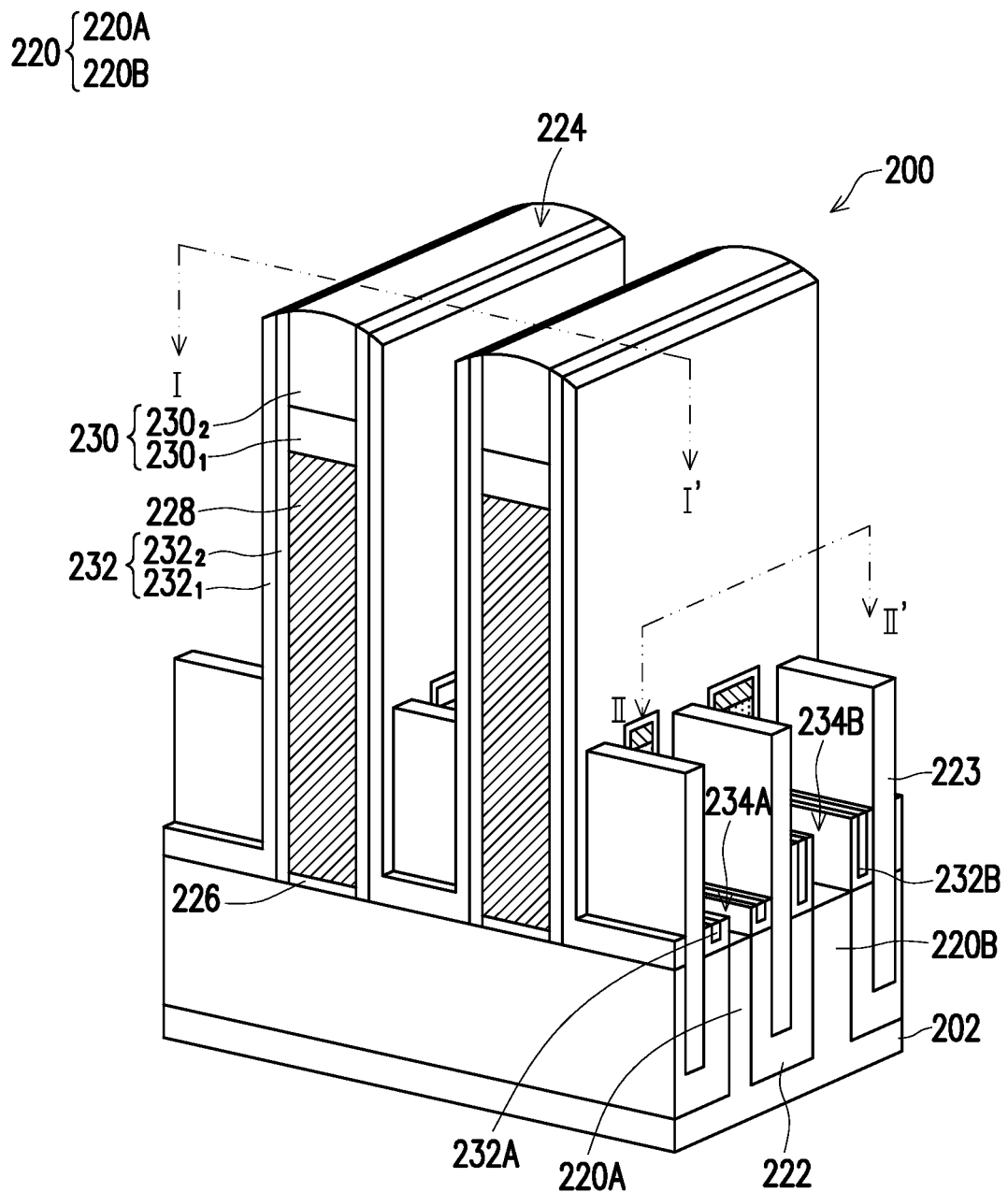
Figure 7B:
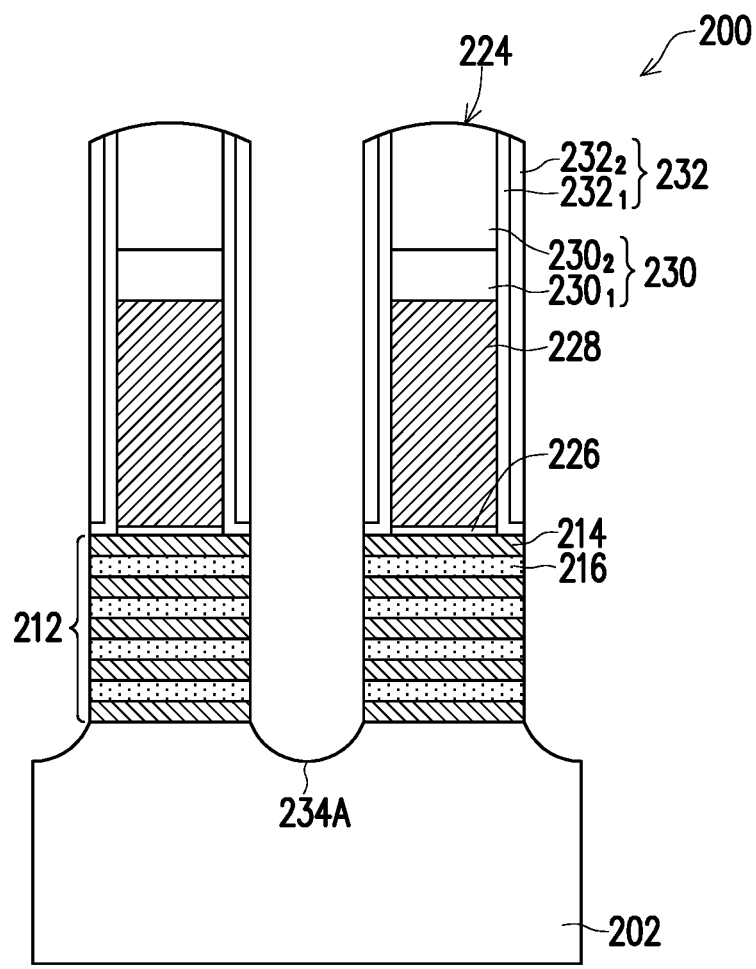
Figure 7C:
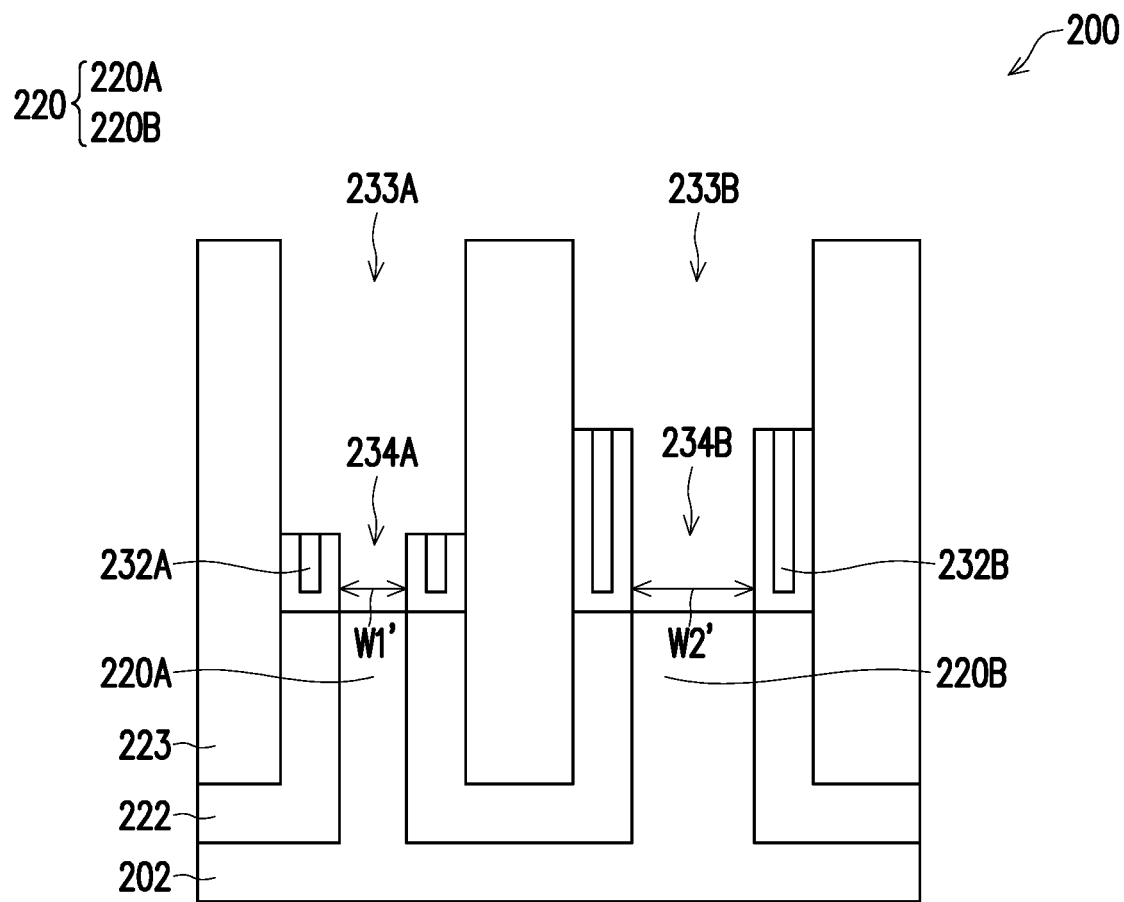

At operation 116, the method 100 (FIG. 1A) recesses a portion of the fin 220A to form source/drain spaces 233A with recesses 234A in the S/D regions, and a second portion of the fin 220B to form the other source/drain spaces 233B with recesses 234B in the other S/D regions as shown in FIGS. 7A, 7B and 7C, where FIG. 7B is a cross-sectional view along I-I' line of the device 200 in FIG. 7A, and FIG. 7C is a cross-sectional view along II-II' line of the device 200 in FIG. 7A. The stacked epitaxial layers 214 and 216 are etched down at the S/D regions. In many embodiments, the operation 114 forms the source/drain spaces 233A and the source/drain spaces 233B by a suitable etching process, such as a dry etching process, a wet etching process, or an RIE process. The etching process at operation 114 may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), oxygen-containing gas (e.g., $O_2$), a chlorine-containing gas (e.g., $Cl_2$), a helium-containing gas (e.g., He), an argon-containing gas (e.g., Ar), other suitable gases, or combinations thereof. During the etching process at the operation 114, the spacers 232 at sidewalls of the portions of the fins 220A and 220B are also recessed, thereby forming spacers 232A and 232B. In some embodiments, the spacer 232B has a height greater than a height of the spacer 232A. The spacers 232A and a surface of the fin 220A form a recess 234A, and the spacers 232B and top surfaces of the fin 220B form a recess 234B. Since the width W1 of the fin 220A is less than the width W2 of the fin 220B, a width W1' of the recess 234A is less than a width W2' of the recess 234B. In some embodiments, the width W1' is in a range from about 6 nm to about 10 nm, while the width W2' is in a range from about 16 nm to about 20 nm.

Figure 8A:
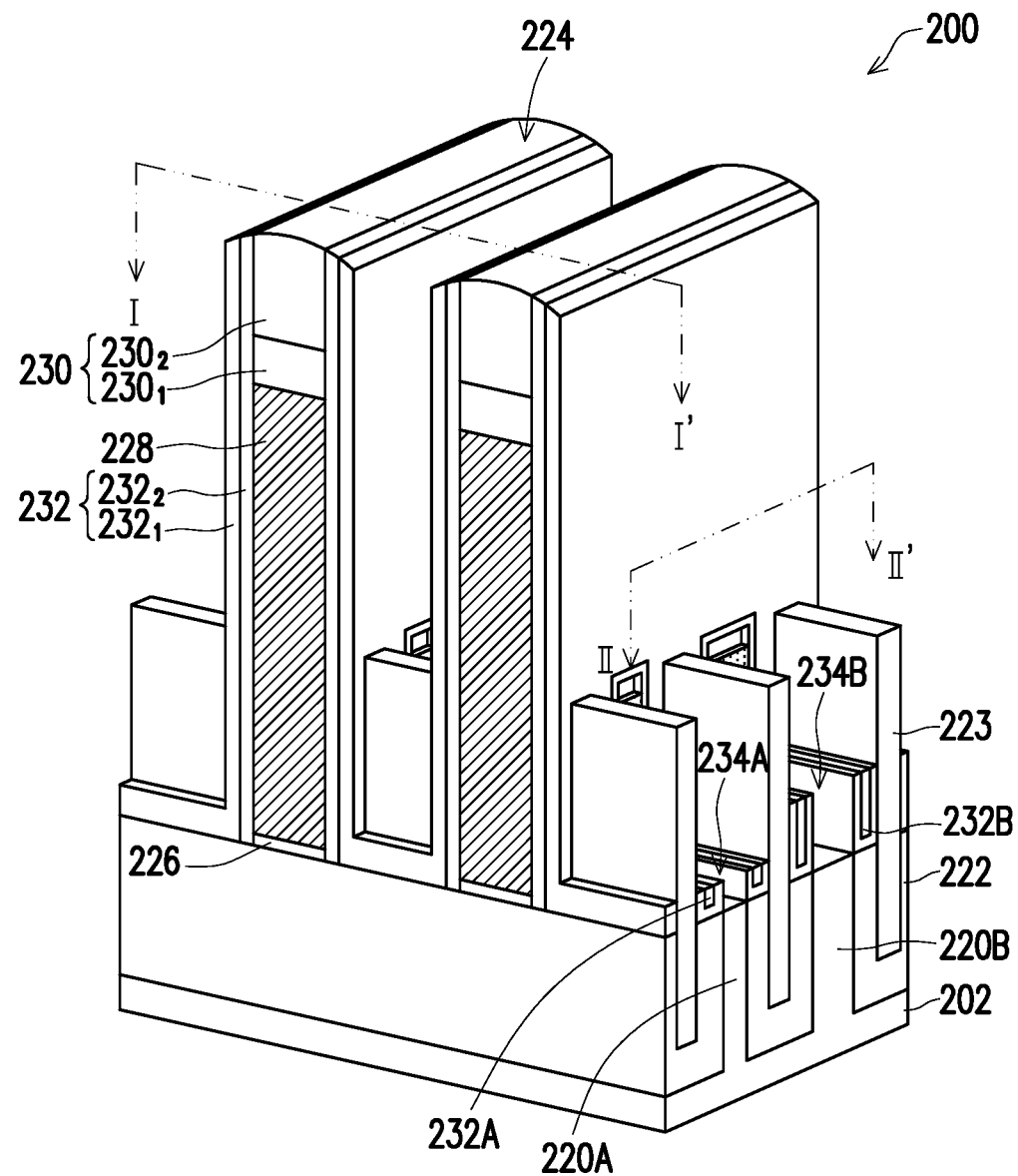
Figure 8B:
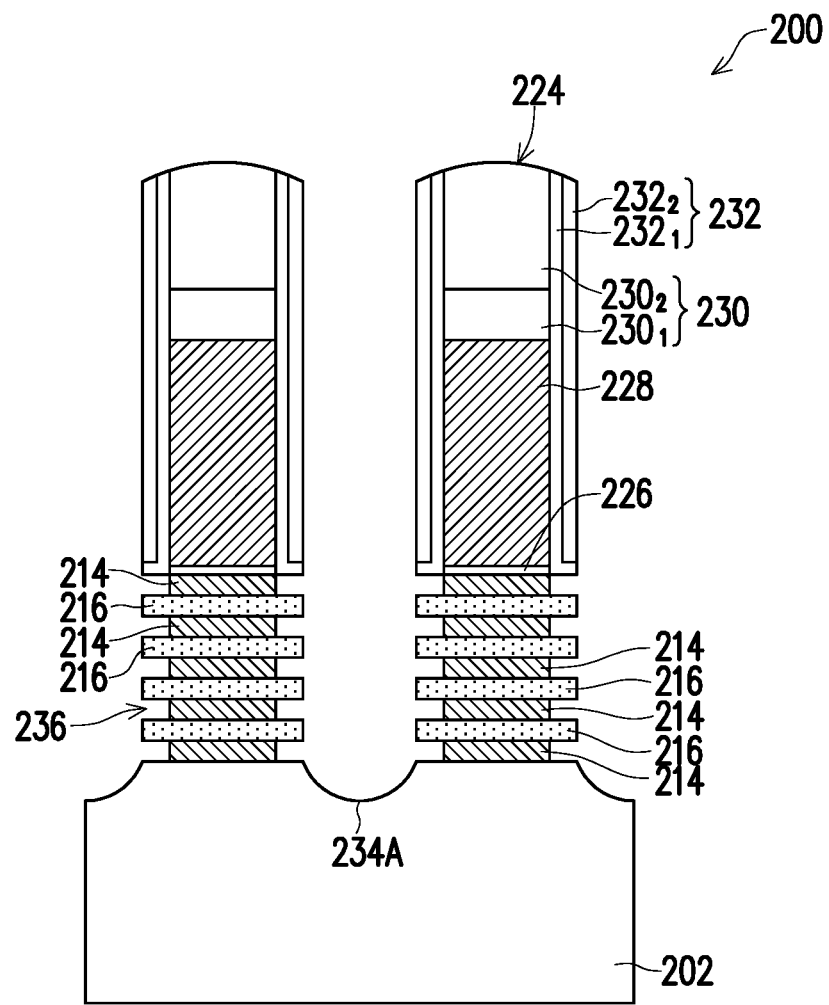
Figure 8C:
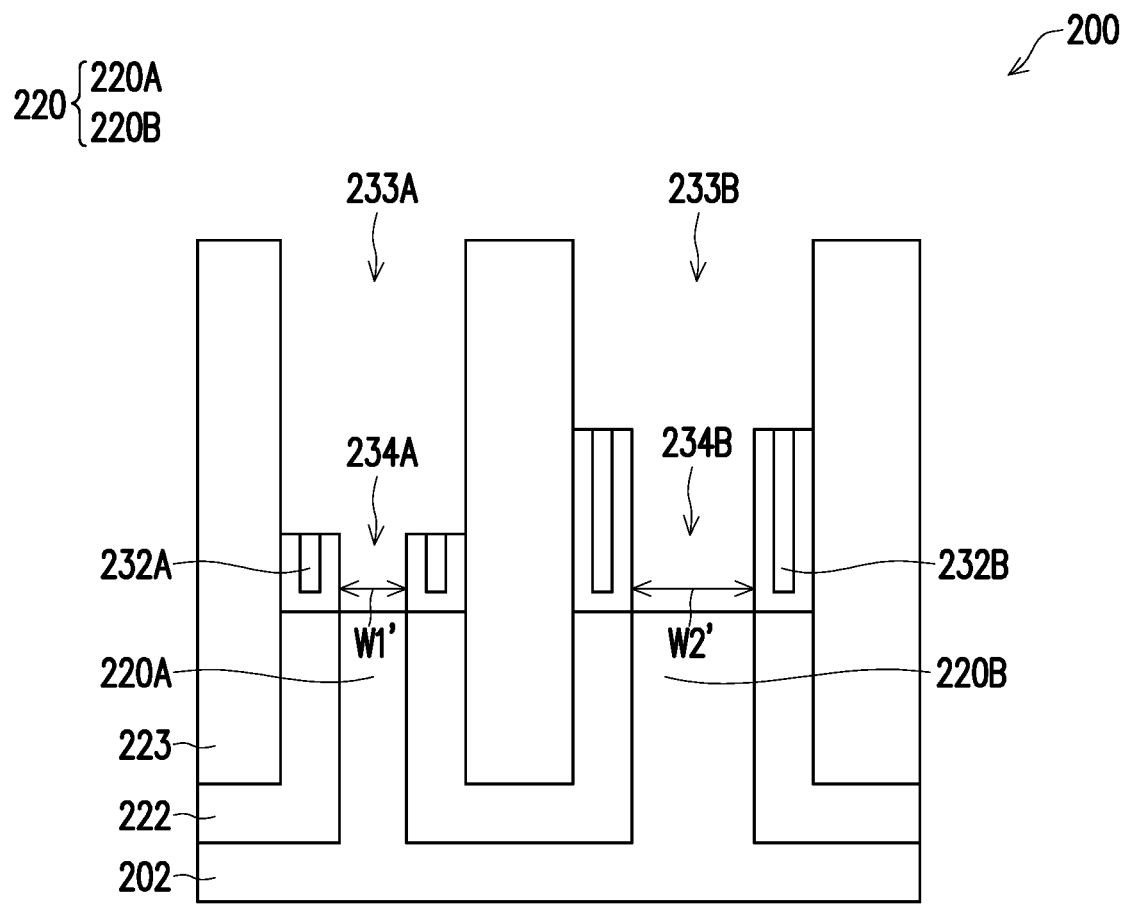

At operation 118, the method 100 (FIG. 1B) forms inner spacers directly under the gate sidewall spacers 232. In some embodiments, the operation 116 first laterally etches the epitaxial layers 214 in the y-direction, thereby forming cavities 236, as shown in FIGS. 8A, 8B and 8C, where FIG. 8B is a cross-sectional view along A-A line of the device 200 in FIG. 8A, and FIG. 8C is a cross-sectional view along II-II' line of the device 200 in FIG. 8A. The amount of etching of the epitaxial layers 214 is in a range from about 1 nm to about 4 nm in some embodiments. The epitaxial layers 214 may be selectively etched by using a wet etchant such as, but not limited to, ammonium hydroxide ($NH_4OH$), tetramethylammonium hydroxide (TMAH), ethylenediamine pyrocatechol (EDP), potassium hydroxide (KOH), HF, $O_3$, $H_2O_2$, or HCl solutions. Alternatively, the operation 116 may first selectively oxidize lateral ends of the epitaxial layers 214 that are exposed in the recesses 234 to increase the etch selectivity between the epitaxial layers 214 and 216. In some examples, the oxidation process may be performed by exposing the device 200 to a wet oxidation process, a dry oxidation process, or a combination thereof.

Figure 9A:
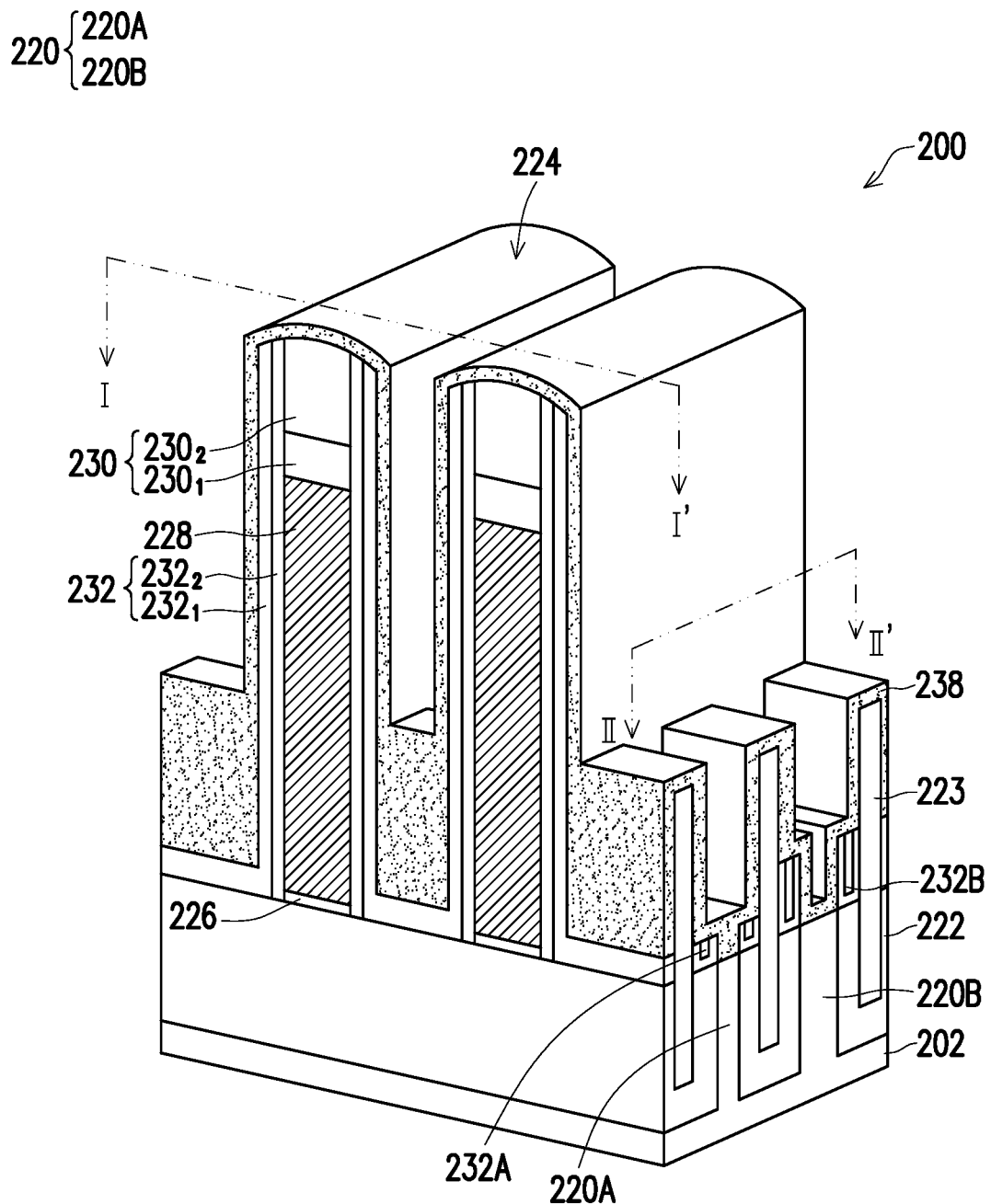
Figure 9B:
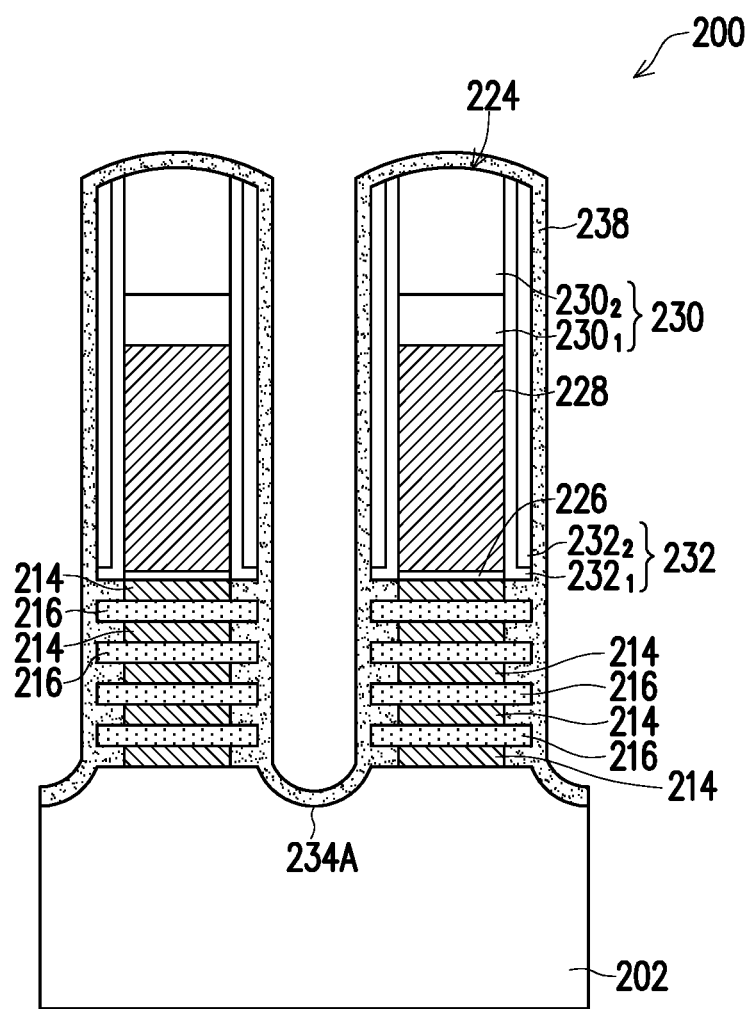
Figure 9C:
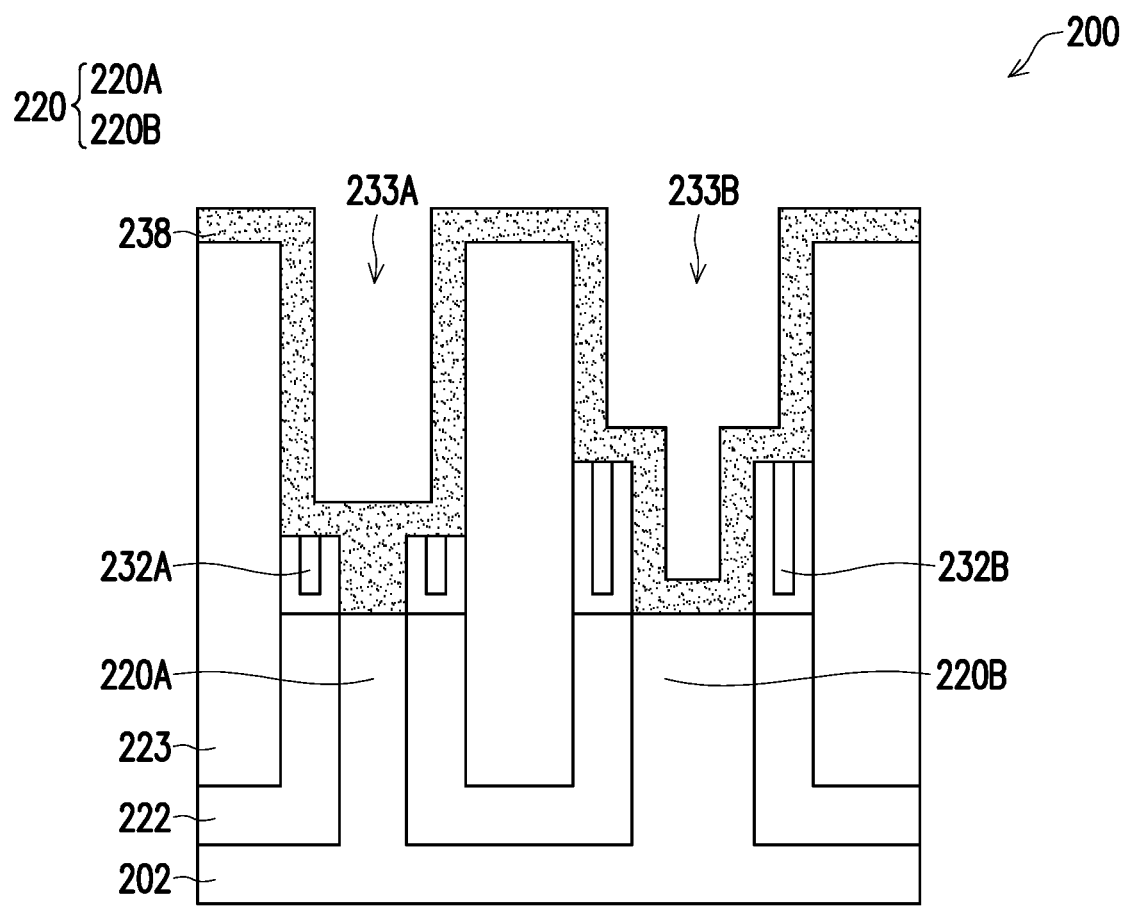

Subsequently, operation 116 forms an inner spacer material layer 238 on the lateral ends of the epitaxial layer 214, on the epitaxial layers 216, on the dielectric fins 223, and in cavities 236 and the recesses 234A and 234B, as shown in FIGS. 9A, 9B and 9C, where FIG. 9B is a cross-sectional view along I-I' line of the device 200 in FIG. 9A, and FIG. 9C is a cross-sectional view along II-II' line of the device 200 in FIG. 9A. The inner spacer material layer 238 may include silicon oxides, silicon nitrides, silicon carbides, silicon carbide nitride, silicon oxide carbide, silicon carbide oxynitride, and/or other suitable dielectric materials. In some embodiments, the inner spacer material layer 238 is deposited as a conformal layer. The inner spacer material layer 238 may be formed by ALD or any other suitable method. By conformally forming the inner spacer material layer 238, the size of the cavity 234 is reduced or the cavity 234 is completely filled. The inner spacer material layer 238 may have a thickness ranging from about 4 nm to about 6 nm, for example. In some embodiments, portions of the inner spacer material layer 238 on sidewalls of the recess 234A are merged so that the recess 234A is completely filled with the inner spacer material layer 238, while portions of the inner spacer material layer 238 on sidewalls of the recess 234B are not merged so that the recess 234B is not completely filled with the inner spacer material layer 238.

Figure 10A:
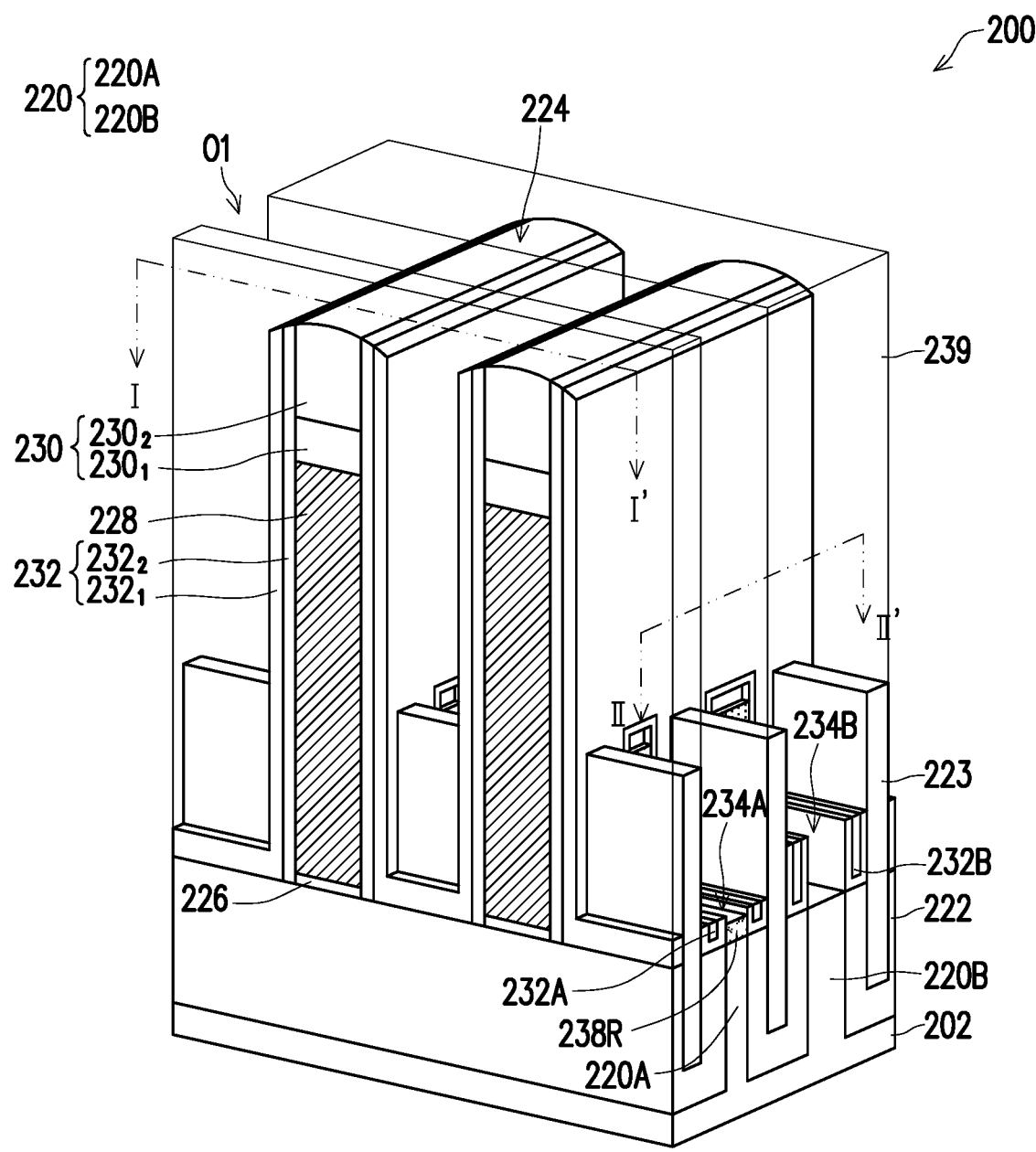
Figure 10B:
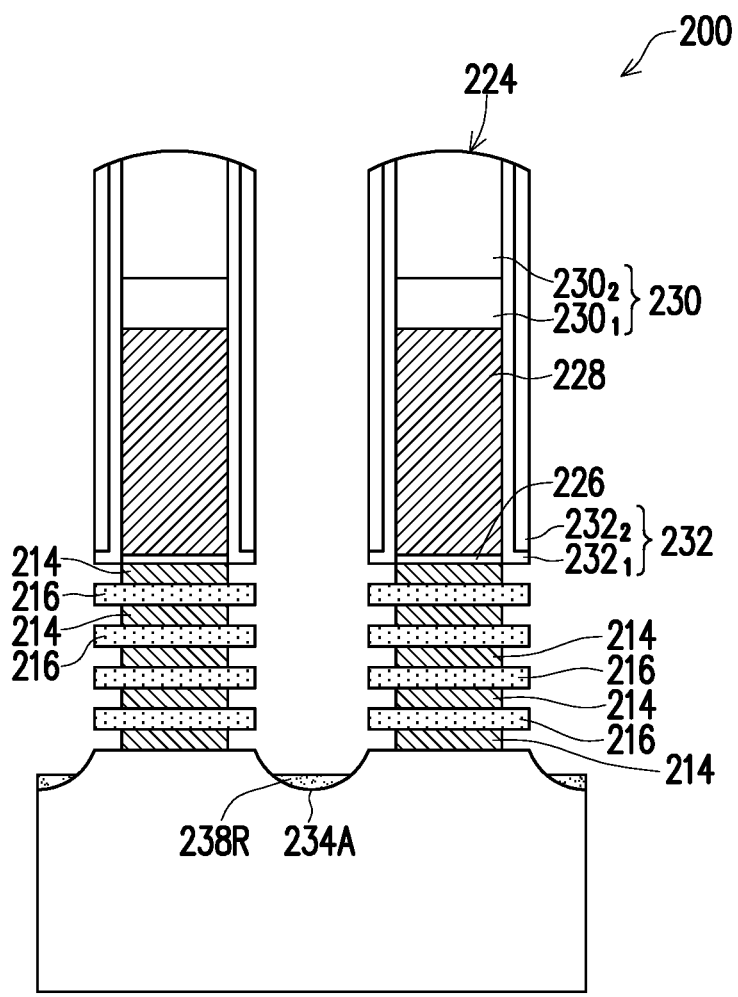
Figure 10C:
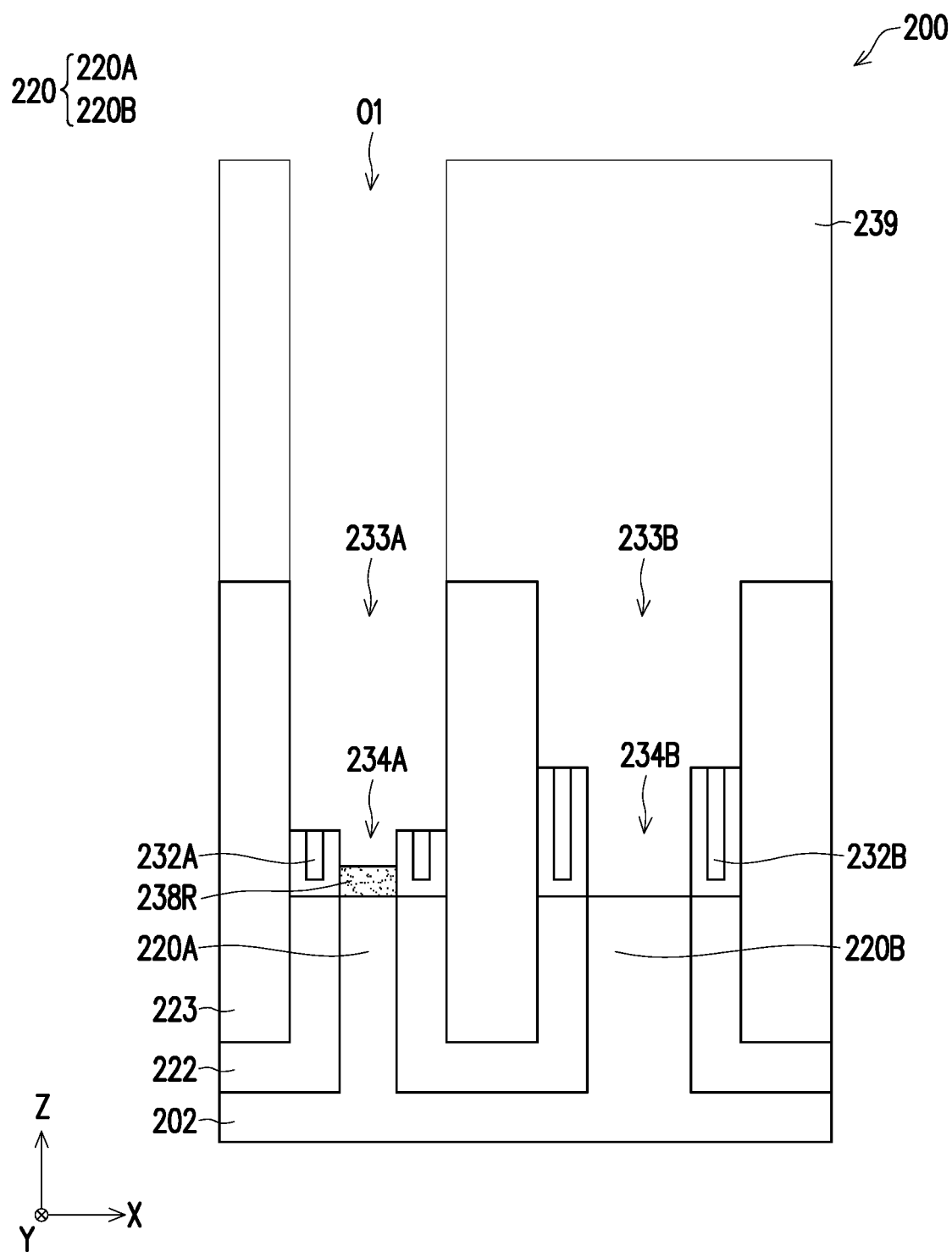

After the inner spacer material layer 238 is formed, an etching process is performed to partially remove the inner spacer material layer 238, as shown in FIGS. 10A, 10B and 10C, where FIG. 10B is a cross-sectional view along I-I' line of the device 200 in FIG. 10A, and FIG. 10C is a cross-sectional view along II-II' line of the device 200 in FIG. 10A. By this etching, the inner spacer material layer 238 remains substantially within the cavity 236, because of a small volume of the cavity. Similarly, the inner spacer material layer 238 remains substantially within the recess 234A, because of a small volume of the recess 234A. Generally, plasma dray etching etches a layer in wide and flat areas faster than a layer in concave (e.g., holes, grooves, recesses and/or slits) portions. Thus, the inner spacer material layer 238 may remain inside the cavities 236 and also remain in the recesses 234A, while the inner spacer material layer 238 may be removed from the recesses 234B. The remained portions of the inner spacer material layer 238 in the cavities 236 are denoted as the inner spacers 238. The remained portions of the inner spacer material layer 238 in the recess 234A are denoted as residues 238R (or referred to as inner spacer residues).

At operation 120, the method 100 (FIG. 1B) performs a treatment process to remove the residue 238R in the recess 234A, so that the fin 220A is exposed, as shown in FIGS. 10A, 10B and 10C. In some embodiments, the treatment process may be performed by a selectively etching process. The selectively remove process may be performed by using photo-lithography and etching. As an example to perform the selectively etching process, a photoresist 239 is formed and patterned on the substrate 202, as shown in FIGS. 10A and 10C. The photoresist 239 may be formed by spin coating or the like and may be exposed to light for patterning. The patterning forms openings O1 through the photoresist 239 to expose the residue 238R and the spacer 232A. After the photoresist 239 is patterned, the photoresist 239 may be referred to as a patterned mask layer. The residue 238R and the spacer 232A are removed by using an acceptable etching process, such as by an anisotropic etching process. In some embodiments, the anisotropic etching process may implement a dry etching process using an etchant including a bromine-containing gas (e.g., HBr and/or $CHBR_3$), a fluorine-containing gas (e.g., $CF_4$, $SF_6$, $CH_2F_2$, $CHF_3$, and/or $C_2F_6$), oxygen-containing gas (e.g., $O_2$), a chlorine-containing gas (e.g., $Cl_2$), a helium-containing gas (e.g., He), an argon-containing gas (e.g., Ar), other suitable gases, or combinations thereof. Thereafter, the photoresist 239 is removed. The photoresist 113 may be removed by an acceptable ashing or stripping process, such as using an oxygen plasma or the like, for example.

Figure 11A:
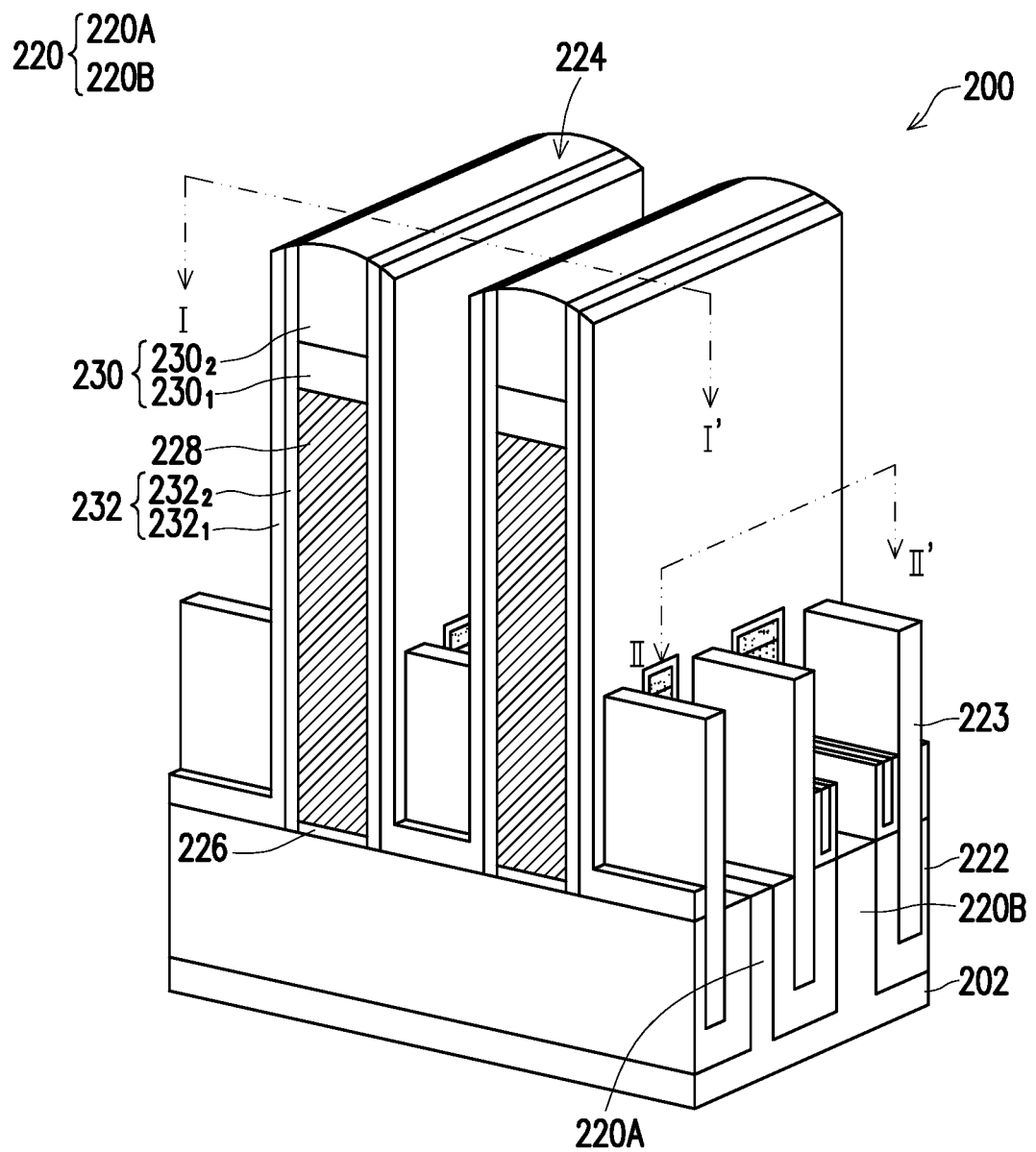
Figure 11B:
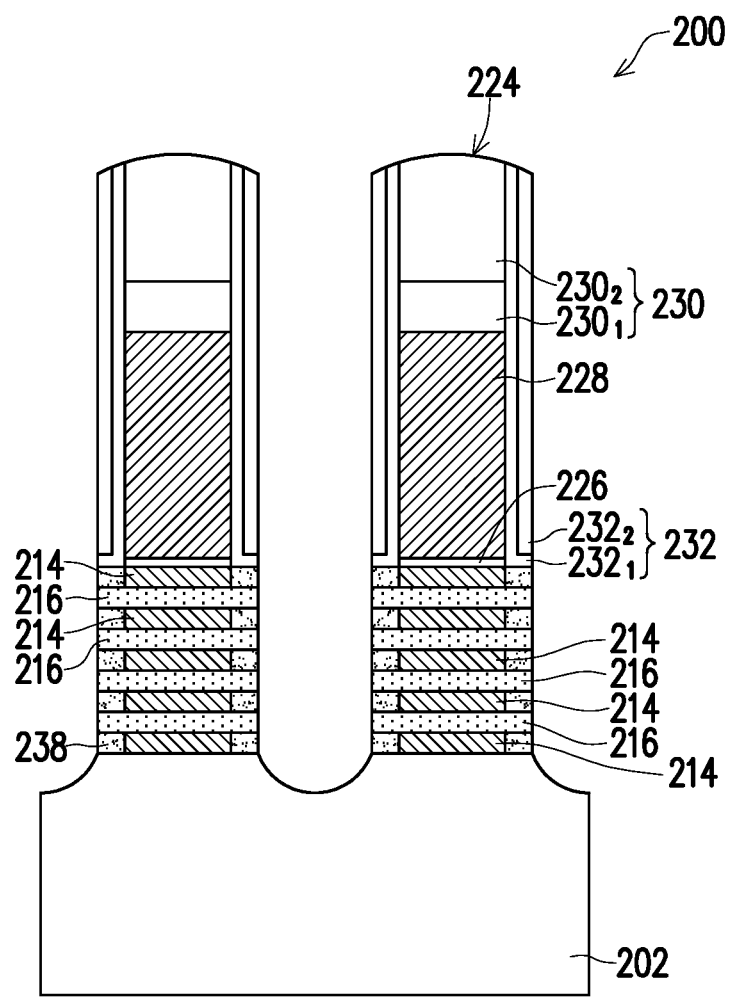
Figure 11C:
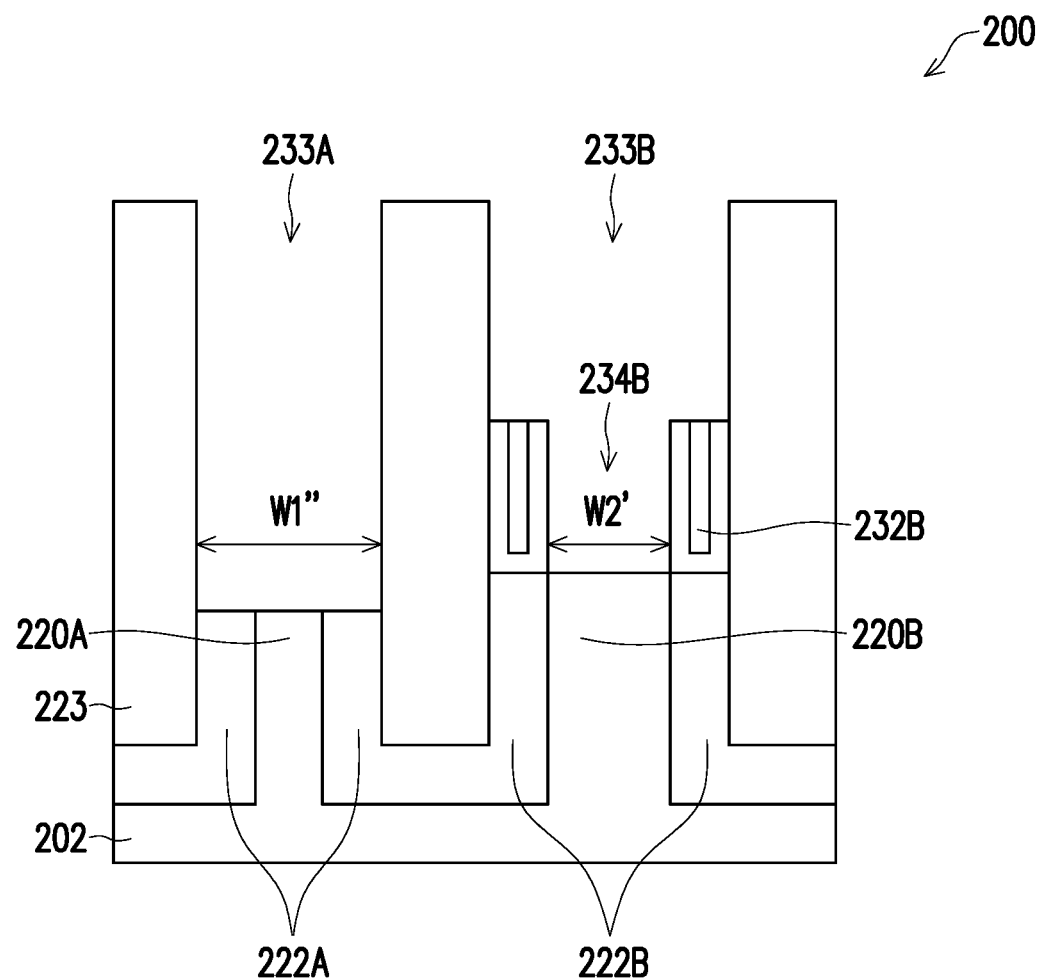
Figure 11D:
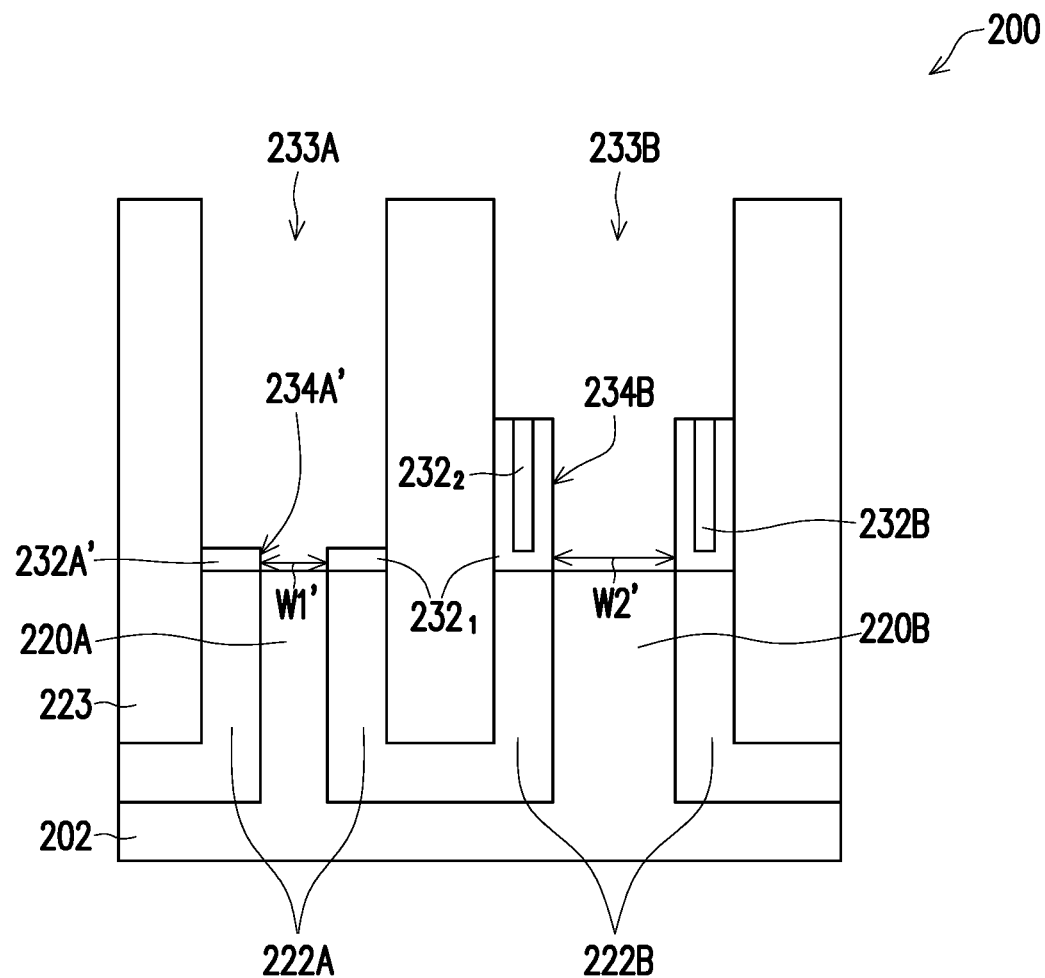
FIGS. 11D and 12D/12E are fragmentary cross-sectional views along the II-II' line of the semiconductor devices in FIGS. 11A and 12A at other various stages of fabrication according to alternative embodiments of the present disclosure.

In some embodiments, the entire spacers 232A and the residues 238R are removed, sidewalls of the dielectric fins 223, a surface of the STI features 222A that are adjacent to the fin 220A, and the surface of the fin 220A are exposed by the source/drain spaces 233A, as shown in FIGS. 11A and 11C, where FIG. 11B is a cross-sectional view along I-I' line of the device 200 in FIG. 11A, and FIG. 11C is a cross-sectional view along II-II' line of the device 200 in FIG. 11A. A bottom of the recess 234B of the source/drain spaces 233B exposes a surface of the fin 220B. In some embodiments, a lower width W1" of the source/drain spaces 233A may be larger than a lower width W2' of the recess 234B. Height of bottom surface of the source/drain spaces 233A may be lower than height of bottom surface of the recess 234B because the fin 220A and the STI features 222A may have some loss during the selectively etching process at the operation 120 or a cleaning process (such as a SiCoNi process) for removing an native oxide after the selectively etching process. In some embodiments, the surface of the STI features 222A is about 2 nm to about 10 nm lower than the surface of the STI features 222B.

In alternative embodiments, the height of the spacers 232A is reduced so that some spacers 232A' may remain on the STI features 222A, while the entire residues 238R are removed to expose the fin 220A during the electively etching process at the operation 120, as shown in FIG. 11D. Sidewalls of the spacers 232A' and the surface of the fin 220A form a recess 234A'. The spacers 232A' and the spacers 232B have different shapes and layers. In some embodiments, the spacer 232A' includes the liner material layers $232_1$, while the spacer 232B includes the liner material layer $232_1$ the dielectric material layer $232_2$ embedded in the liner material layer $232_1$. The cross-sectional shape of the liner material layers $232_1$ of the spacer 232A' has an "-" shape, for example, while the cross-sectional shape of the liner material layer $232_1$ of the spacer 232 has an "U" shape, and the cross-sectional shape of the dielectric material layer $232_2$ of the spacer 232 has an "I" shape. The height of the spacers 232A' is less than a height of the spacers 232B. In some embodiments, the spacer 232A' has the height in a range from about 5 nm to about 10 nm, and the spacer 232B has the height in a range from about 10 nm to about 30 nm. The width W1' of the recess 234A' may be less than the width W2' of the recess 234B. In some embodiments, the width W1' is in a range from about 6 nm to about 10 nm, while the width W2' is in a range from about 16 nm to about 20 nm. The aspect ratio of the recess 234A' may be less than 1.7. In some embodiments, the aspect ratio of the recess 234A' is in a range from 0 to 1.7.

At operation 122, the method 100 (FIG. 1B) forms epitaxial S/D features 240A and 240B in the source/drain spaces 233A and 233B, respectively. In some embodiments, the epitaxial S/D features 240A and 240B include silicon for an n-type FET and SiGe for a p-type FET. The epitaxial S/D features 240A and 240B may be formed by an epitaxial growth method using CVD, ALD or molecular beam epitaxy (MBE). Since the residue 238R is removed, the epitaxial S/D features 240A and 240B can grow from the fins 220A and 220B at the bottom of the source/drain spaces 233A, and from the epitaxial layers 216 at the sidewalls of the source/ drain spaces 233A. Therefore, the epitaxial S/D features 240A and 240B have fewer merge defect and good quality.

Figure 12A:
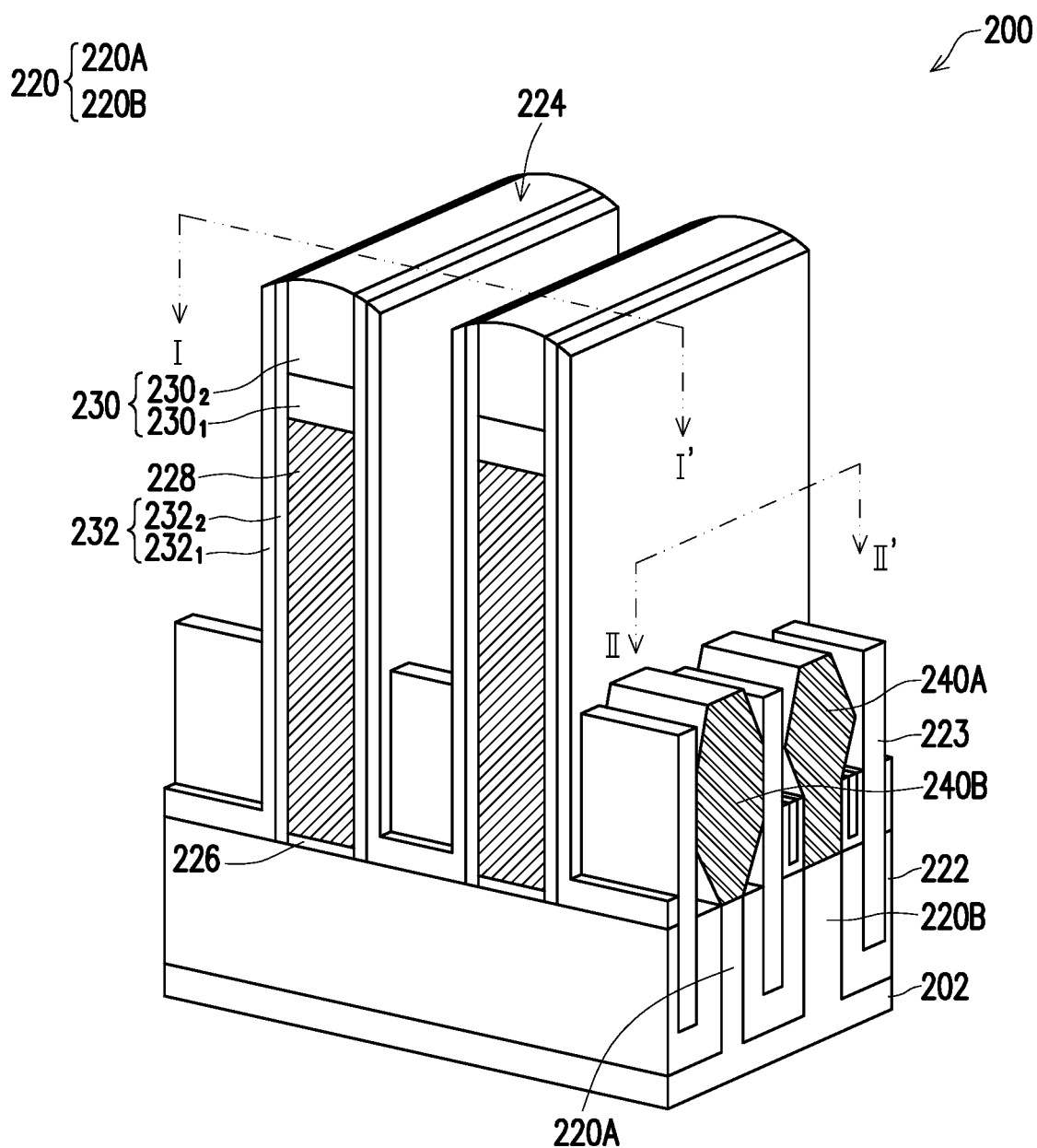
Figure 12B:
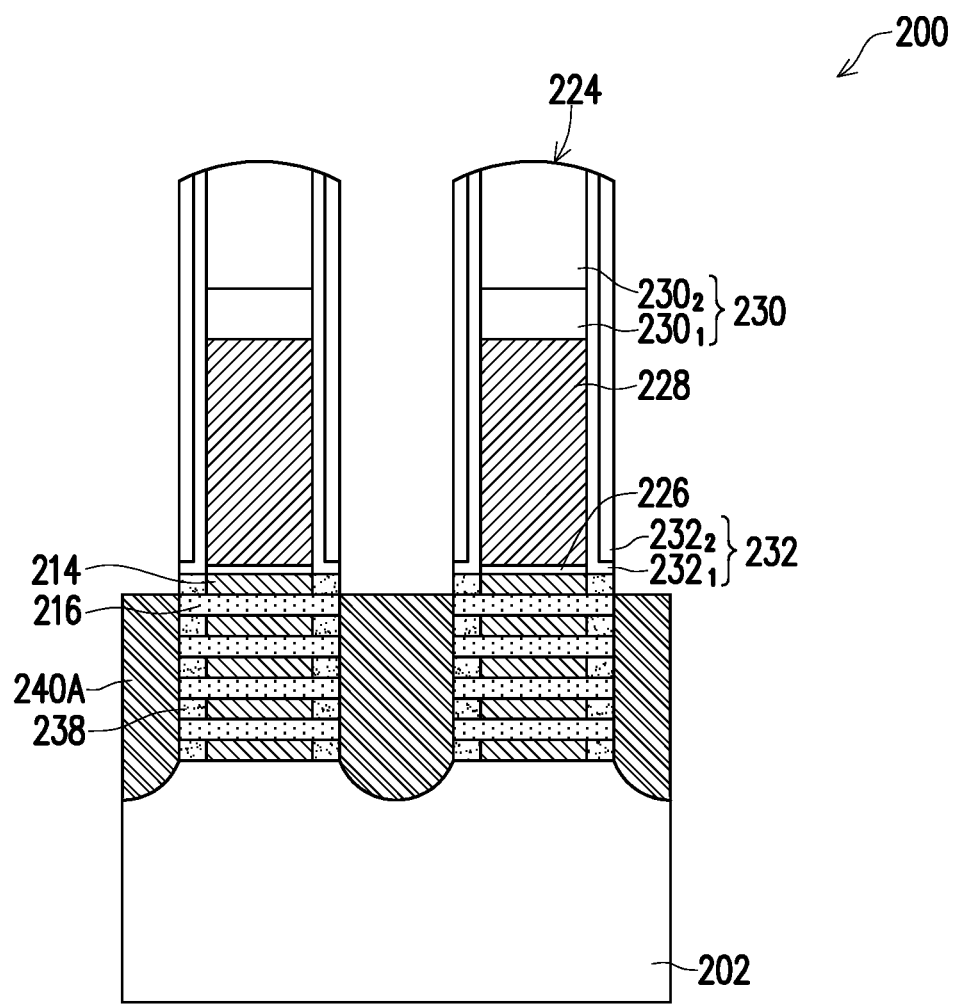
Figure 12C:
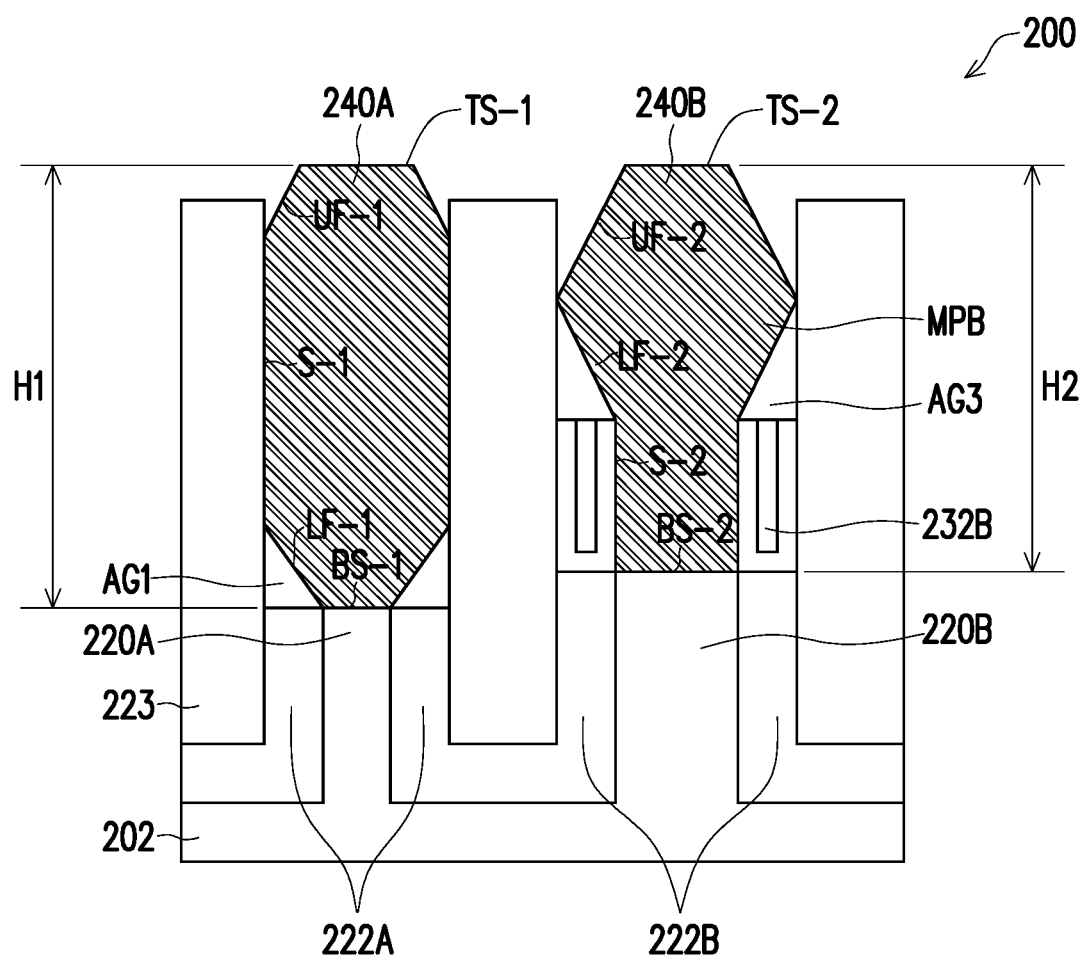
Figure 12D:
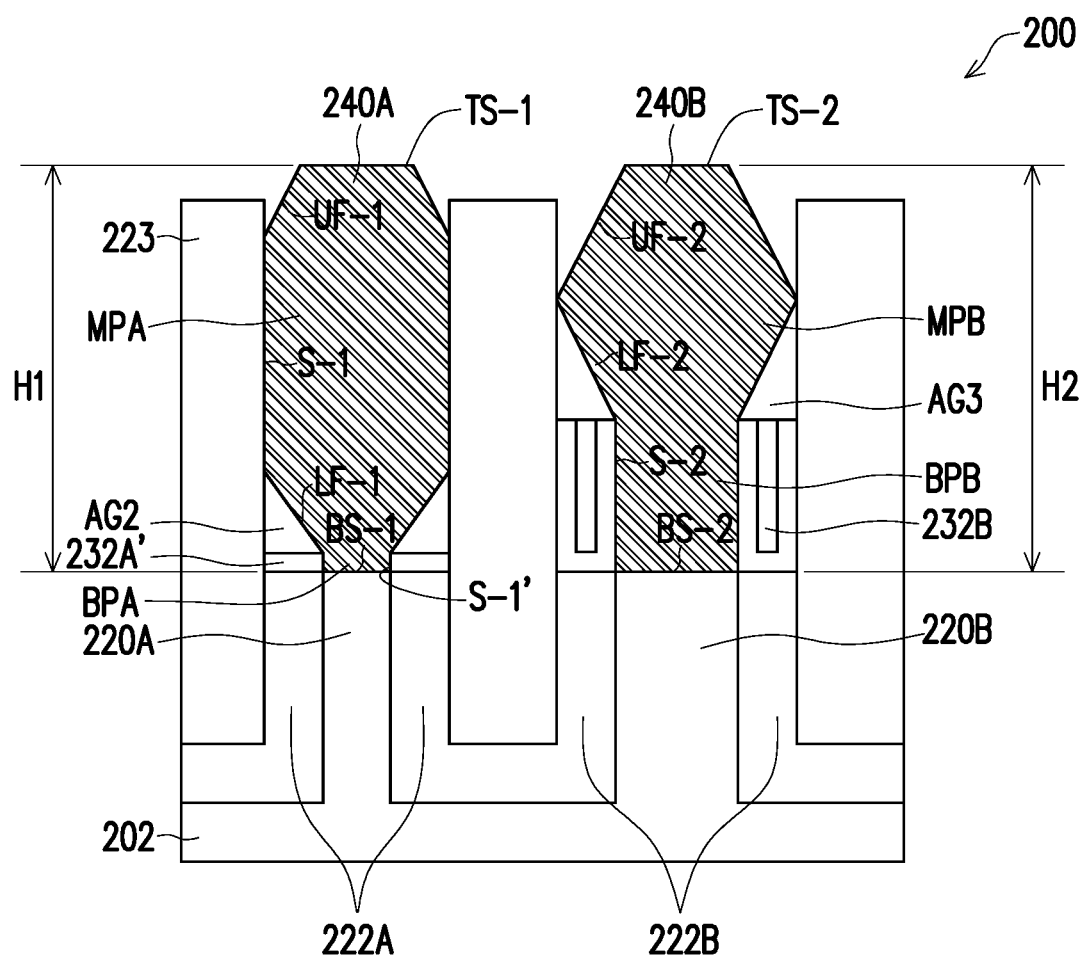

The epitaxial S/D features 240A and 240B are formed in contact with the epitaxial layers 216 of the fins 220, and separated from the epitaxial layers 214 of the fins 220 by the inner spacers 238 respectively, and the epitaxial S/D features 240A are separated from the epitaxial S/D features 240B by the dielectric fins 223, as shown in FIGS. 12A, 12B and 12C, where FIG. 12B is a cross-sectional view along I-I' line of the device 200 in FIG. 12A, and FIG. 12C is a cross-sectional view along II-II' line of the device 200 in FIG. 12A. In some embodiment, cavities 236 are not filled by the inner spacer material 238 but be capped by the epitaxial S/D features 240A or 240B. Therefore, cavities 236 is also referred to as "air spacer".

Figure 12E:
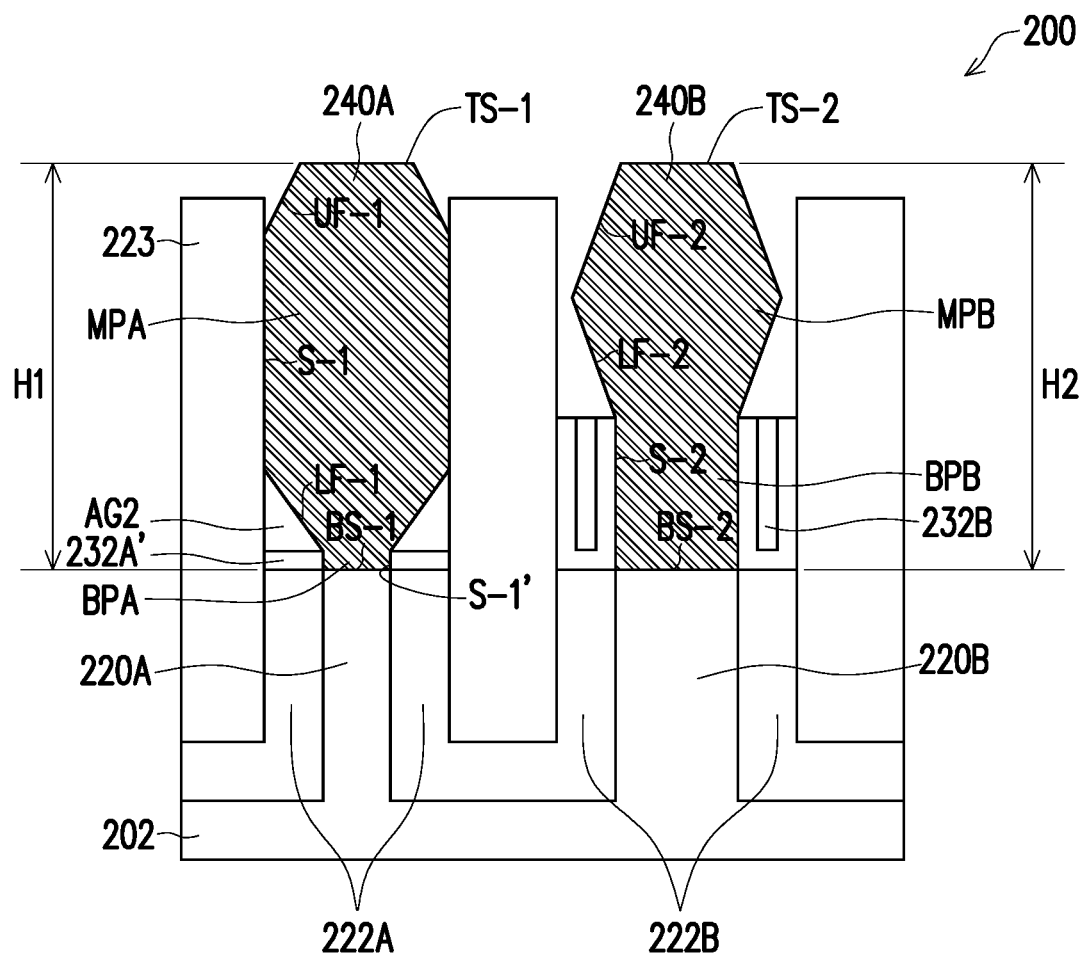

In the illustrated embodiments, the epitaxial S/D feature 240A and the epitaxial S/D feature 240B have different shapes, as shown in FIGS. 12C, 12D and 12E. The cross-sectional shape of the epitaxial S/D feature 240A is octagonal, for example. the epitaxial S/D feature 240A is in physically contact with the fin 220A and the hybrid fin 223. In some embodiments, the epitaxial S/D feature 240A has a bottom surface BS-1, lower facets LF-1, sidewalls S-1, upper facets UF-1 and a top surface TS-1. The bottom surface BS-1 is in physically contact with the surface of the fin 220A. A first edge of the lower facet LF-1 of the epitaxial S/D feature 240A is connected to an edge of the bottom surface BS-1 of the epitaxial S/D feature 240A and in physically contact with the fin 220A and the STI feature 222A. A second edge of the lower facets LF-1 of the epitaxial S/D feature 240A is connected to a bottom edge of the sidewall S-1 of the epitaxial S/D feature 240A and in physically contact with the hybrid fin 223. The sidewalls S-1 of the epitaxial S/D feature 240A are in physically contact with portion sidewalls of the dielectric fins 223. A first edge of the upper facet UF-1 of the epitaxial S/D feature 240A is connected to a top edge of the sidewall S-1 of the epitaxial S/D feature 240A and in physically contact with the hybrid fin 223. A second edge of the upper facets UF-1 of the epitaxial S/D feature 240A is connected to an edge of a top surface TS-1 of the epitaxial S/D feature 240A. In some embodiments, the top surface TS-1 and the bottom surface B-1 of the epitaxial S/D feature 240A are {100} facets, the lower facets LF-1 and the upper facets UF-1 of the epitaxial S/D feature 240A are {111} facets, and the sidewalls S-1 of the epitaxial S/D feature 240A are {110} facets. In addition, a surface of the lower facet LF-1, the top surface of the STI feature 222A and the other portion sidewall of the hybrid fin 223 form an air gap AG1, and a shape of the air gap AG1 may be, for example, a triangle. The sidewalls S-1 of the epitaxial S/D feature 240A may not be vertical because the dielectric fins 223 may be damaged during the aforementioned etching process. In some embodiments, top sidewalls of the hybrid fin 223 are damaged, so that an upper width of the hybrid fin 223 is less than a lower width thereof. Therefore, upper portion of the sidewalls S-1 may be greater than lower portion thereof.

The epitaxial S/D feature 240B has a base portion BPB on the fin 220B, while the epitaxial S/D feature 240A does not have base portion, as shown in FIG. 12C. The epitaxial S/D feature 240B further has a main portion MPB on the base portion BPB. The base portion BPB has a rectangular cross-sectional shape, and the main portion MPB has a hexagonal cross-sectional shape, for example. The base portion BPB has a bottom surface BS-2 and sidewalls S-2. The bottom surface BS-2 of the base portion BPB is in physically contact with the surface of the fin 220B. The sidewalls S-2 of the base portion BP are in physically contact with the spacers 232B. A bottom edge of the sidewall S-2 of the base portion BP is connected to an edge of the bottom surface BS-2 of the base portion BPB and in physically contact with the second fin 220B and the STI feature 222B. A top edge of the sidewall S-2 of the base portion BPB is connected to the main portion MPB and in physically contact with the spacer 232B. A bottom of the main portion MPB is connected to a top of the base portion BPB. The main portion MPB has lower facets LF-2, upper facets UF-2, and a top surface TS-2. The lower facet LF-2 is connected to a top edge of the sidewall S-2 of the base portion BP, and the upper facet UF-2 is connected to an edge of the top surface TS-2. The lower facet LF-2 and the upper facet UF-2 are in physically contact with each other. In some embodiments, the bottom surface BS-2 of the base portion BP and the top surface TS-2 of the of the main portion MPB are {100} facets, the sidewall S-2 of the base portion BP are {110} facets, and the lower facets LF-2 and the upper facets UF-2 of the main portion MPB are {111} facets.

In some embodiments, the lower facets LF-2 and the lower facets LF-2 of the main portion MPB are in physically contact with the dielectric fins 223, as shown in FIGS. 12C and 12D. In addition, a surface of the lower facets LF-2 of the main portion MP, a top surface of the spacers 232B, and a portion sidewall of the hybrid fin 223 form an air gap AG3, and a shape of the air gap AG3 may be, for example a triangle. In alternative embodiments, the lower facets LF-2 and the lower facets LF-2 of the main portion MPB does not contact the hybrid fin 223, as shown in FIG. 12E.

In alternative embodiments in which the spacers 232A' remain on the STI features 222A as shown in FIG. 11D, the epitaxial S/D feature 240A includes a base portion BPA formed in the recess 234A' and a main portion MPA on the base portion BPA, as shown in FIGS. 12D and 12E. A bottom surface BS-1 of the base portion BPA is in physically contact with the fin 220A. Sidewalls S-1' of the base portion BPA are in physically contact with the spacers 232A'. First edges of lower facets LF-1 of the main portion MPA are in physically contact with the base portion BPA, and second edges of the lower facets LF-1 of the main portion MPA are in physically contact with the hybrid fin 223. In addition, a surface of the lower facets LF-1 of the main portion MPA, a top surface of the spacers 232A', and a portion sidewall of the hybrid fin 223 form an air gap AG2, and a shape of the air gap AG2 may be, for example, a triangle.

The bottom surface BS-1 of the epitaxial S/D feature 240A may be equal to or lower than the bottom surface BS-2 of the epitaxial S/D feature 240B, as shown in FIGS. 12C to 12E. The height H1 of the epitaxial S/D feature 240A may be equal to or greater than the height H2 of the epitaxial S/D feature 240B, as shown in FIGS. 12C to 12E. The contact areas of the epitaxial S/D feature 240A and the dielectric fins 223 may be greater than the contact areas of the epitaxial S/D feature 240B and the spacers 232B, as shown in FIG. 12C. The contact areas of the epitaxial S/D feature 240A and the spacers 232A' are less than contact areas of the epitaxial S/D feature 240B and the spacers 232B, as shown in FIG. 12D or 12E. The contact areas of the epitaxial S/D feature 240A and the dielectric fins 223 is greater than the contact areas of the epitaxial S/D feature 240B and the dielectric fins 223, as shown in FIGS. 12C and 12D.

Figure 13A:
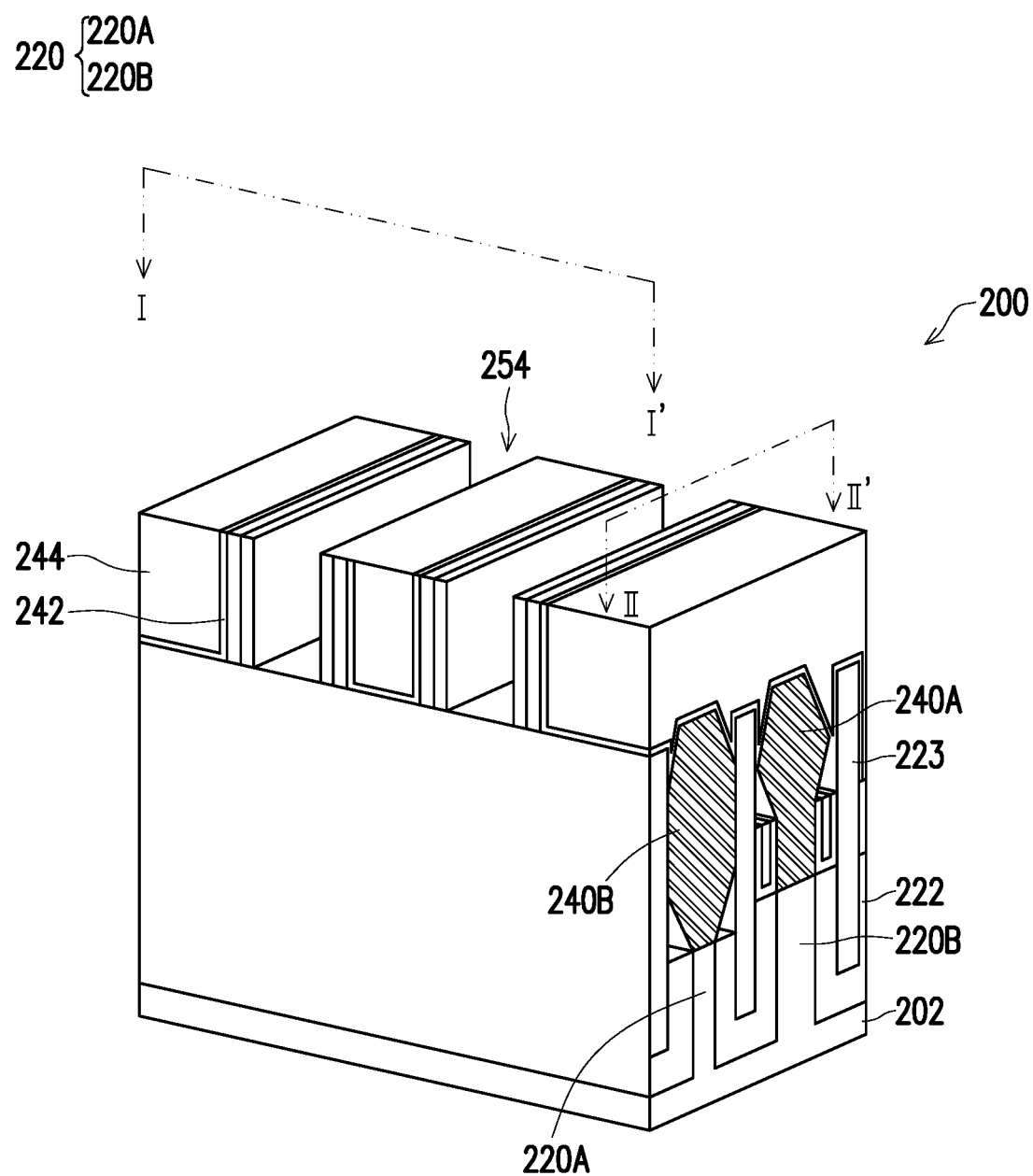
Figure 13B:
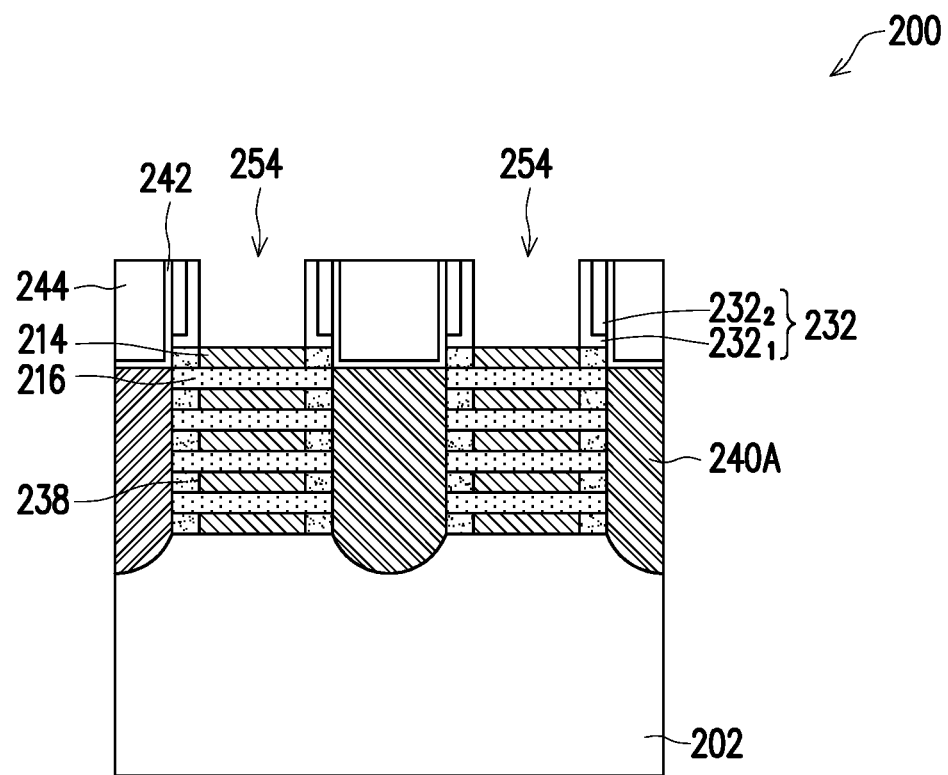
Figure 13C:
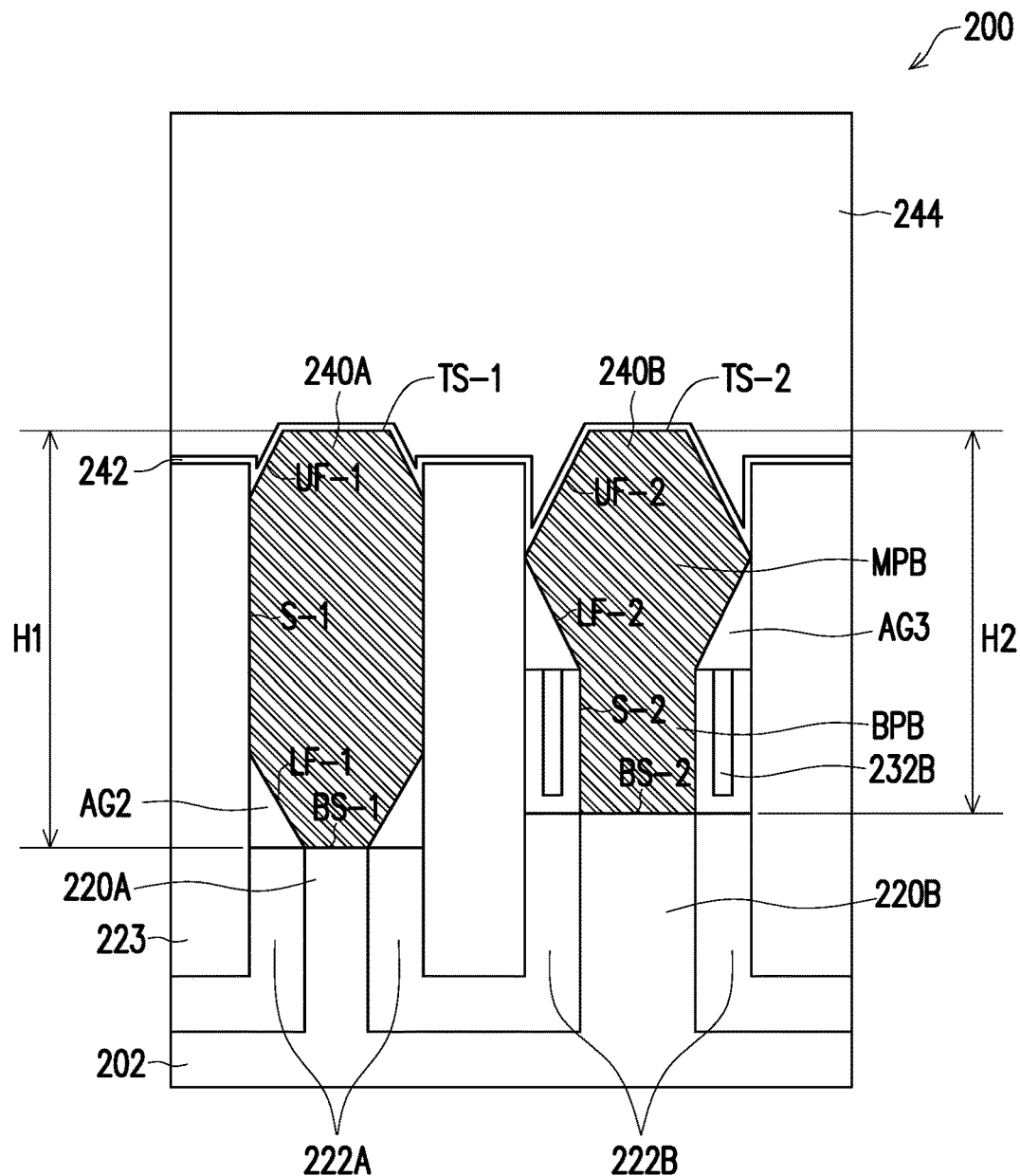

At operation 124, the method 100 (FIG. 1B) forms a contact etch stop layer (CESL) 242 over the epitaxial S/D features 240A and 240B and an interlayer dielectric (ILD) layer 244 over the CESL layer 242, as shown in FIGS. 13A, 13B and 13C, where FIG. 13B is a cross-sectional view along I-I' line of the device 200 in FIG. 13A, and FIG. 13C is a cross-sectional view along II-II' line of the device 200 in FIG. 13A. The CESL layer 242 may comprise silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. In some embodiments, forming the ILD layer 244 further includes performing a CMP process to planarize a top surface of the device 200, such that the top surfaces of the sacrificial gate structure 224 are exposed.

At operation 126 the method 100 (FIG. 1B) removes the sacrificial gate structures 224 to form gate trenches 254, as shown in FIGS. 13A, 13B and 13C. The ILD layer 244 and the CESL layer 242 protects the epitaxial S/D features 240A and 240B during the removal of the sacrificial gate structure 224. The sacrificial gate structure 224 may be removed using plasma dry etching and/or wet etching. When the sacrificial gate electrode layer 228 is polysilicon and the ILD layer 244 is silicon oxide, a wet etchant such as a TMAH solution may be used to selectively remove the sacrificial gate electrode layer. The sacrificial gate dielectric layer 226 is thereafter removed using plasma dry etching and/or wet etching.

Figure 14A:
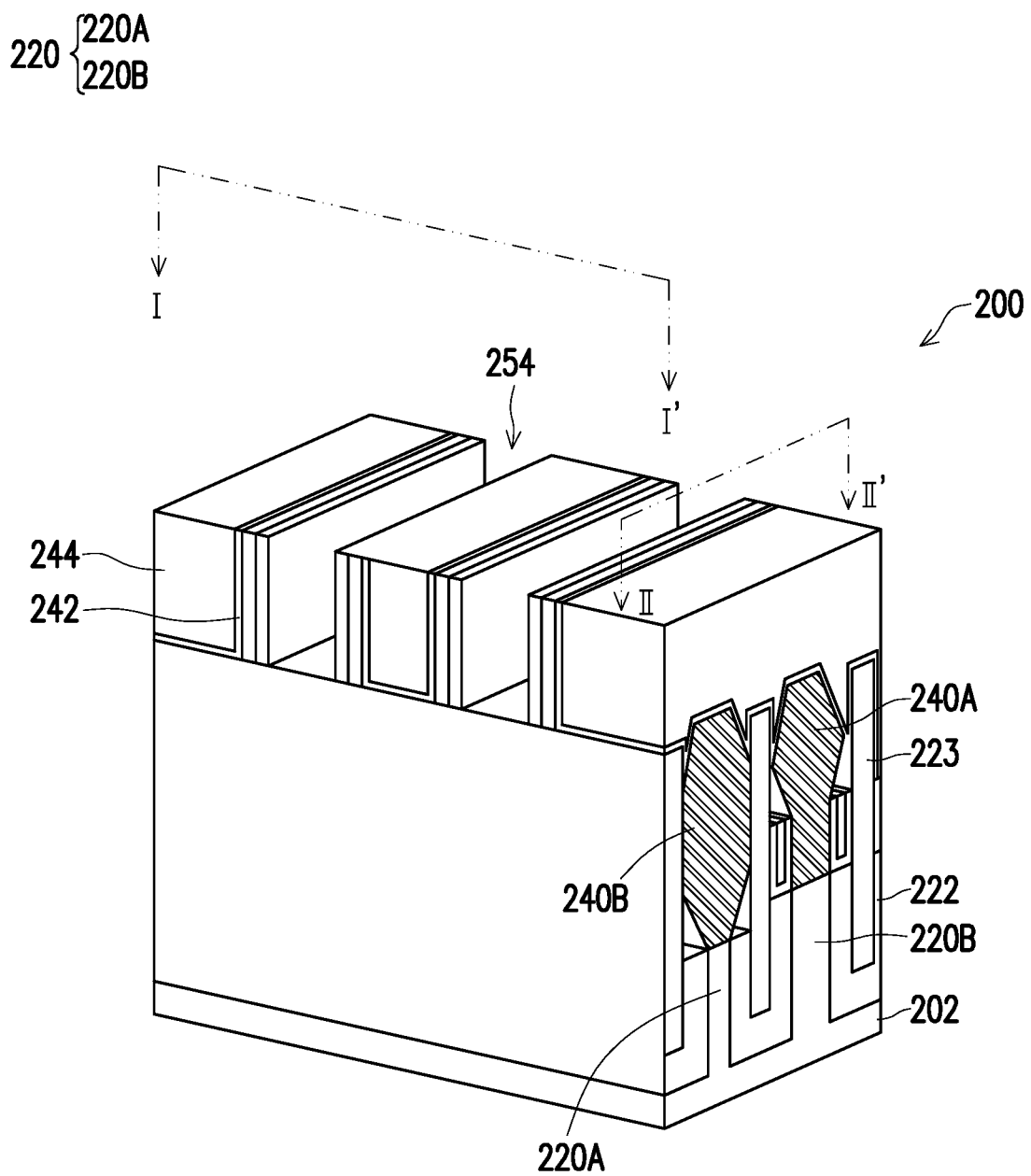
Figure 14B:
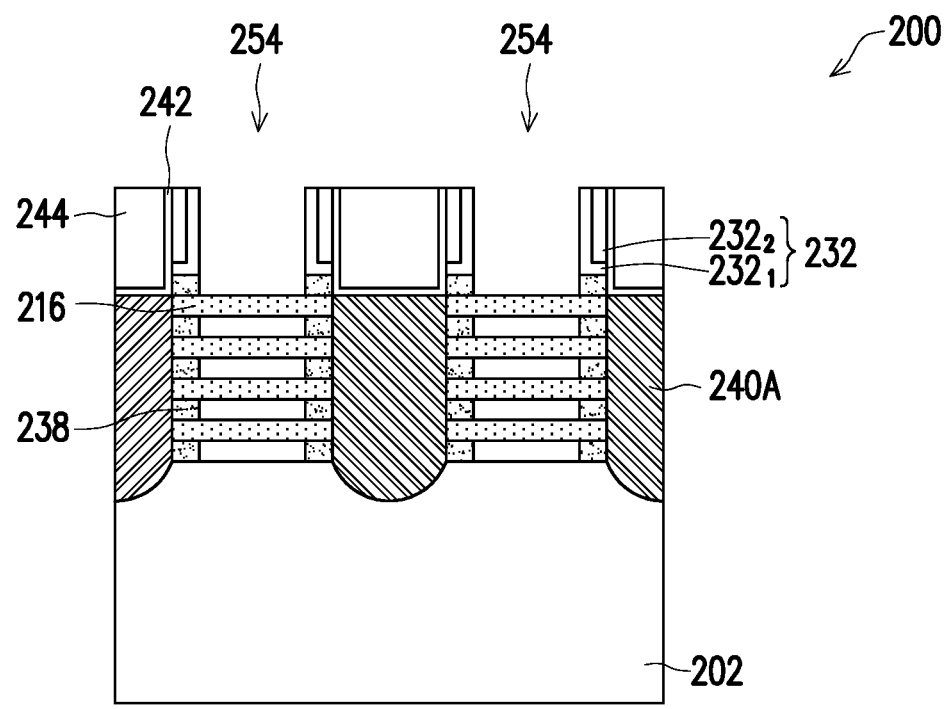
Figure 14C:
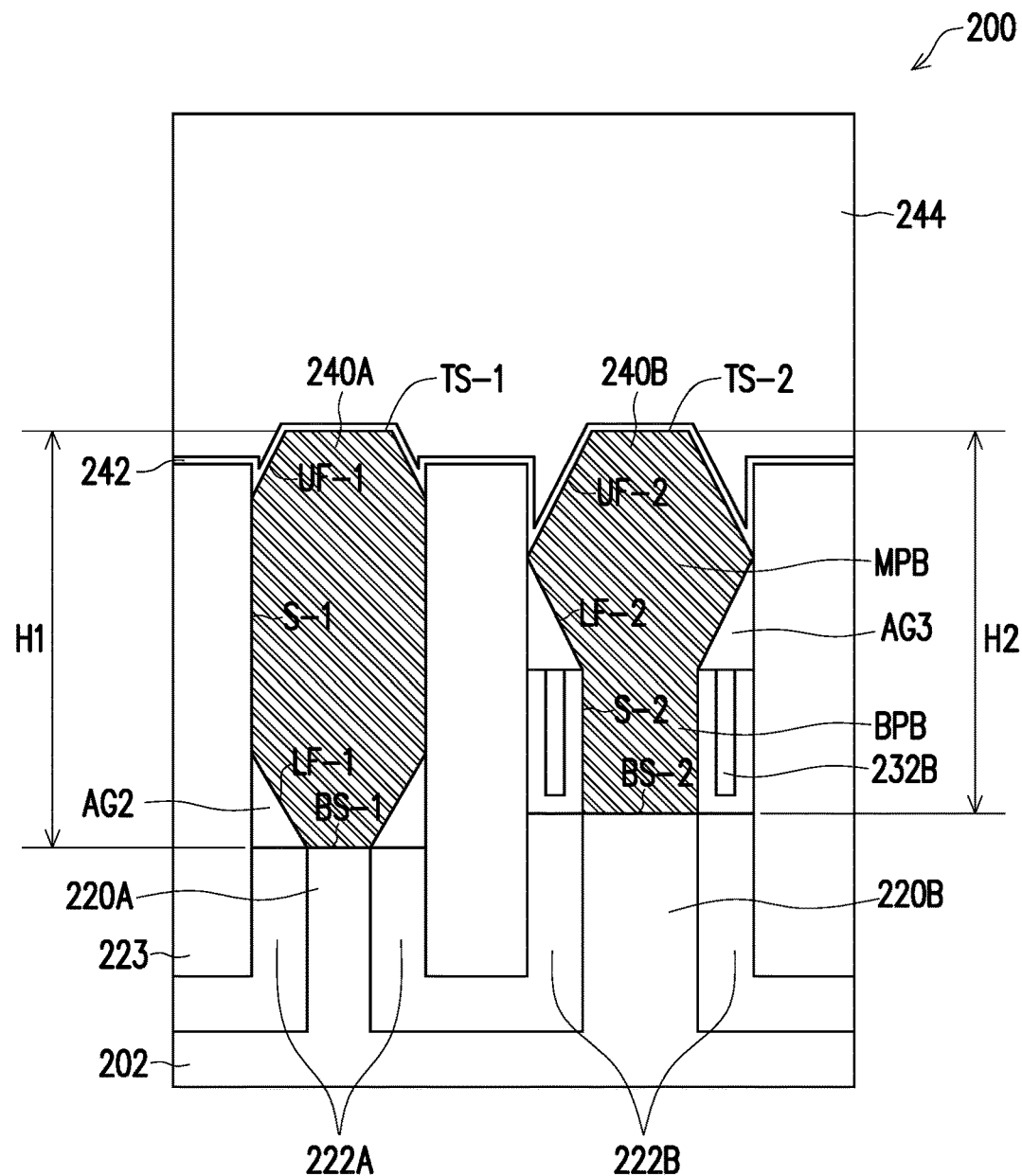

At operation 128, the method 100 (FIG. 1B) releases channel members from the channel region of the GAA device 200, as shown in FIGS. 14A, 14B and 14C, where FIG. 14B is a cross-sectional view along I-I' line of the device 200 in FIG. 14A, and FIG. 14C is a cross-sectional view along II-II' line of the device 200 in FIG. 14A. In the illustrated embodiment, channel members are epitaxial layers 216 in the form of nanosheets. In the present embodiment, the epitaxial layers 216 include silicon, and the epitaxial layers 214 include silicon germanium. The plurality of epitaxial layers 214 may be selectively removed. In some implementations, the selectively removal process includes oxidizing the plurality of epitaxial layers 214 using a suitable oxidizer, such as ozone. Thereafter, the oxidized epitaxial layers 214 may be selectively removed. To further this embodiment, the operation 128 includes a dry etching process to selectively remove the epitaxial layers 214, for example, by applying an HCl gas at a temperature of about 0° C. to about 150° C., or applying a gas mixture of $CF_4$, $SF_6$, $CHF_3$, HF, $NH_3$, $F_2$, $ClF_3$, $N_2$, Ar, and/or He. For the sake of simplicity and clarity, after operation 130, the epitaxial layers 216 are denoted as nanosheets 216. At this point, as shown in FIG. 14A, vertically stacked nanosheets 216 are formed in the channel regions of GAA device.

Figure 15A:
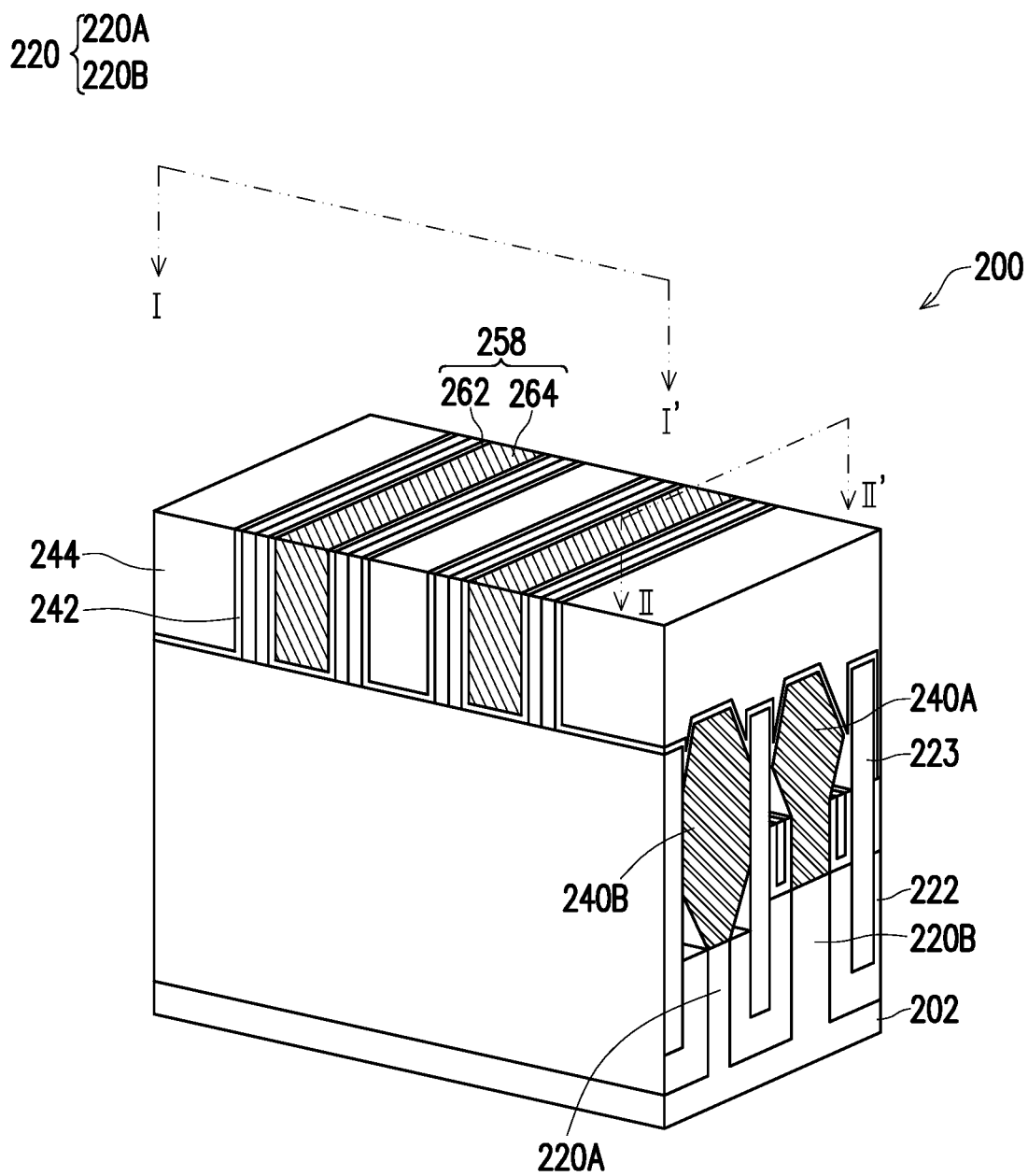
Figure 15B:
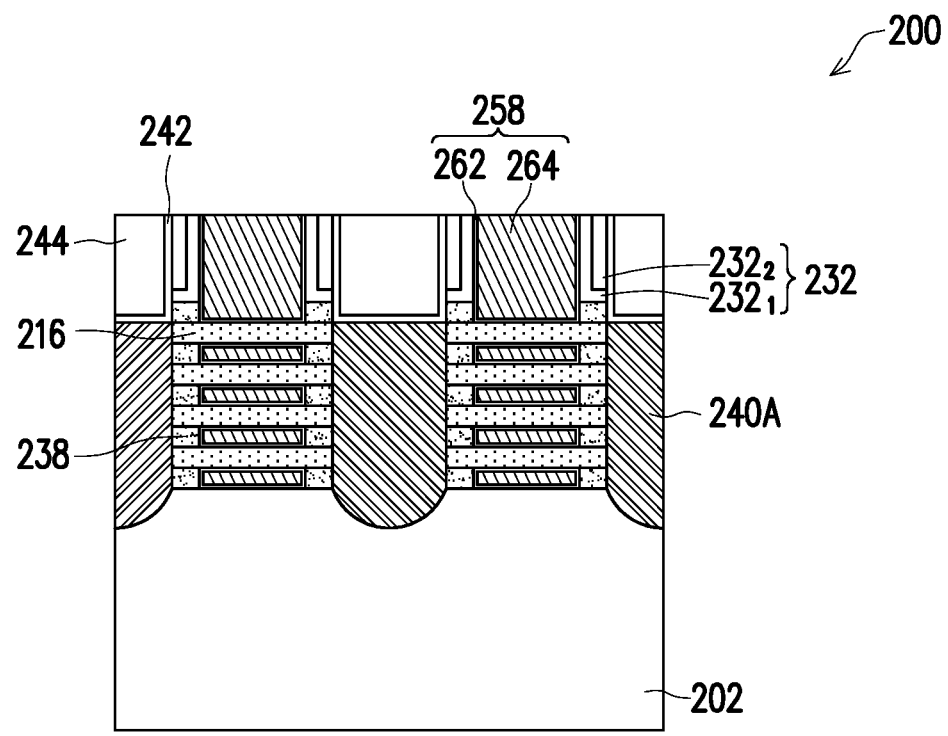
Figure 15C:
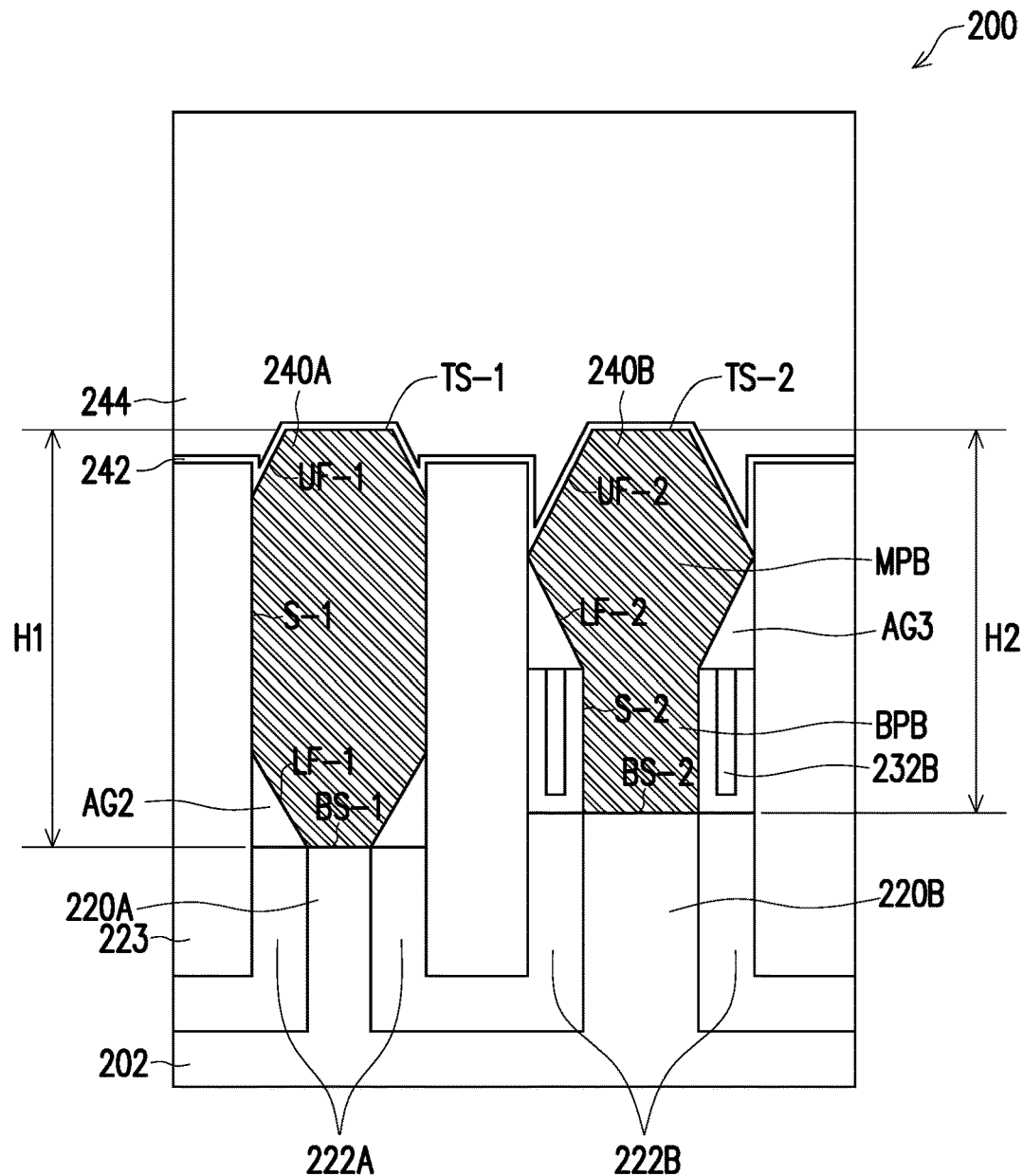

At operation 130, the method 100 (FIG. 1B) forms metal gate structure 258 in the gate trench 254 engaging the nanosheets 216 in the channel region, as shown in FIGS. 15A, 15B and 15C, where FIG. 15B is a cross-sectional view along I-I' line of the device 200 in FIG. 15A, and FIG. 15C is a cross-sectional view along II-II' line of the device 200 in FIG. 15A. A gate dielectric layer 262 is formed wrapping each nanosheet 216 in the channel region, and a gate electrode layer 264 is formed on the gate dielectric layer 262. The inner spacers 238 separate the metal gate structure 258 from the epitaxial S/D features 240.

In some embodiments, the gate dielectric layer 262 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 262 includes an interfacial layer (not shown) formed between the channel layers and the dielectric material. The gate dielectric layer 262 may be formed by CVD, ALD or any suitable method. In one embodiment, the gate dielectric layer 262 is formed using a highly conformal deposition process such as ALD in order to ensure the formation of a gate dielectric layer having a uniform thickness around each channel layers. The thickness of the gate dielectric layer 262 is in a range from about 1 nm to about 6 nm in some embodiments.

The gate electrode layer 264 is formed on the gate dielectric layer 262 to surround each channel layer. The gate electrode layer 264 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 264 may be formed by CVD, ALD, electro-plating, or other suitable method. In certain embodiments of the present disclosure, one or more work function adjustment layers (not shown) are interposed between the gate dielectric layer 262 and the gate electrode 264. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The gate dielectric layer 262, the work function adjustment layer, and the gate electrode layer 264 may also be deposited over the upper surfaces of the ILD layer 244 and the CESL layer 242. The gate dielectric layer 262 and the gate electrode layer 264 formed over the ILD layer 244 and the CESL layer 242 are then planarized by using, for example, CMP, until the top surfaces of the ILD layer 244 and the CESL layer 242 is revealed. In some embodiments, after the planarization operation, the gate electrode layer 264 is recessed and a cap insulating layer (not shown) is formed over the recessed gate electrode 264. The cap insulating layer includes one or more layers of a silicon nitride-based material, such as SiN. The cap insulating layer may be formed by depositing an insulating material followed by a planarization operation.

Although not intended to be limiting, one or more embodiments of the present disclosure provide many benefits to a semiconductor device and the formation thereof. The present disclosure provides methods of forming a GAA device including a selectively etching process to remove inner spacer reside. Accordingly, this provides a benefit of epitaxial S/D feature with fewer merge defect, better strain, and higher mobility, and better device performance. Furthermore, the GAA flow with selectively etching process may be easily integrated into existing semiconductor fabrication processes.

In some embodiment, the present disclosure is directed to a method of manufacturing a semiconductor device. The method comprises providing a semiconductor substrate; forming an epitaxial stack on the semiconductor substrate, wherein the epitaxial stack comprises a plurality of first epitaxial layers interposed by a plurality of second epitaxial layers; patterning the epitaxial stack and the semiconductor substrate to form a semiconductor fin; recessing a portion of the semiconductor fin to form source/drain spaces; laterally removing portions of the plurality of first epitaxial layers exposed by the source/drain spaces to form a plurality of cavities; forming inner spacers in the plurality of cavities; performing a treatment process to remove an inner spacer residue in the source/drain spaces; forming S/D features in the source/drain spaces; and forming a gate structure engaging the semiconductor fin.

In another some embodiments, the present disclosure is directed to a method of manufacturing a multi-gate device. The method comprises providing a semiconductor substrate; forming a plurality of semiconductor nanosheets on a first portion of the semiconductor substrate; forming an epitaxial source/drain (S/D) feature on a second portion of the semiconductor substrate, wherein the epitaxial source/drain (S/D) feature is in contact with the plurality of semiconductor nanosheets; forming a gate structure wrapping each of the plurality of semiconductor nanosheets; and before the forming the epitaxial source/drain (S/D) feature, performing a treatment process to remove a residue on a surface of the second portion of the semiconductor substrate.

In yet another embodiments, the present disclosure is directed to a semiconductor device. The semiconductor device comprises a semiconductor substrate; a plurality of semiconductor nanosheets disposed over a first portion of the semiconductor substrate; a plurality of source/drain (S/D) features on a second portion of the semiconductor substrate and abutting the plurality of semiconductor nanosheets; and an isolation feature around the second portion of the semiconductor substrate, wherein there is an air gap between the isolation feature and the source/drain (S/D) feature, and a top surface of the isolation feature and a lower facet of the source/drain (S/D) feature are exposed by the air gap.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate comprising a first fin and a second fin, wherein the first fin has a first width less than a second width of the second fin, and a top surface of the first fin is lower than a top surface of the second fin;
   a plurality of semiconductor nanosheets disposed on the first fin and the second fin;
   a plurality of source/drain (S/D) features on the first fin and the second fin and abutting the plurality of semiconductor nanosheets; and
   a gate stack wrapping each of the plurality of semiconductor nanosheets.

2. The semiconductor device of claim 1, wherein a bottom surface of the plurality of source/drain (S/D) features on the first fin is lower than a bottom surface of the plurality of source/drain (S/D) features on the second fin.

3. The semiconductor device of claim 1, wherein a height of the plurality of source/drain (S/D) features on the first fin is larger than a height of the plurality of source/drain (S/D) features on the second fin.

4. The semiconductor device of claim 1, wherein the plurality of source/drain (S/D) features on the first fin is isolated from the plurality of source/drain (S/D) features on the second fin through a hybrid fin.

5. The semiconductor device of claim 4, wherein a first sidewall of the hybrid fin is exposed by a first air gap laterally aside the plurality of source/drain (S/D) features on the first fin, and a second sidewall of the hybrid fin is exposed by a second air gap located laterally aside the plurality of source/drain (S/D) features on the second fin, and the first sidewall is lower than the second sidewall.

6. The semiconductor device of claim 4, wherein the plurality of source/drain (S/D) features on the second fin have base portions connected to the second fin, and the first source/drain (S/D) feature is free from base portion.

7. The semiconductor device of claim 6, further comprising spacers laterally between the base portions and the hybrid fin.

8. The semiconductor device of claim 4, wherein the plurality of source/drain (S/D) features on the first fin have first base portions, the plurality of source/drain (S/D) features on the second fin have second base portions, and a height of the first base portions are lower than a height of the second base portions.

9. The semiconductor device of claim 8, further comprising:
   first spacers surround the first base portions; and
   second spacers surround the second base portions, and a height of the first spacers are lower than a height of the second spacers.

10. A semiconductor device, comprising:
    a semiconductor substrate comprising a first fin and a second fin, wherein the first fin has a first width less than a second width of the second fin;
    an isolation feature around the first fin and the second fin, wherein a surface of the isolation feature around the first fin is lower than a second surface of the isolation feature around the second fin;
    a plurality of gate stack over the first fin and the second fin; and
    a plurality of first source/drain (S/D) features on the first fin and a plurality of second source/drain (S/D) features on the second fin.

11. The semiconductor device of claim 10, wherein a bottom surface of the plurality of first source/drain (S/D) features is lower than a bottom surface of the plurality of second source/drain (S/D) features.

12. The semiconductor device of claim 11, further comprising a hybrid fin isolates the plurality of first source/drain (S/D) features from the plurality of second source/drain (S/D) features.

13. The semiconductor device of claim 12, wherein a lower portion of the hybrid fin is surrounded by the isolation feature.

14. The semiconductor device of claim 10, further comprising spacers, wherein the spacers surround base portions of the plurality of second source/drain (S/D) features.

15. The semiconductor device of claim 11, wherein the plurality of first source/drain (S/D) features, the hybrid fin, and the isolation feature form first air gaps, and the plurality of second source/drain (S/D) features, the hybrid fin, and the spacers form second air gaps, and the first air gaps are lower than the second air gaps.

16. A method of manufacturing a multi-gate device, comprising:
    providing a semiconductor substrate, wherein the semiconductor substrate has a first fin and a second fin, the first fin has a first width less than a second width of the second fin;
    forming a plurality of semiconductor nanosheets on the first fin and the second fin;
    performing a selectively etching process to remove a portion of the first fin so that a top surface of the first fin is lower than a top surface of the second fin;
    forming an epitaxial source/drain (S/D) feature on the first fin and the second fin and abutting the plurality of semiconductor nanosheets; and
    forming a gate structure wrapping each of the plurality of semiconductor nanosheets.

17. The method of claim 16, further comprising
    forming an isolation feature around the first fin and the second fin,
    wherein the selectively etching process is performed to further expose a surface of the isolation feature around the first fin.

18. The method of claim 16, wherein the selectively etching process is performed to further remove a portion of the isolation feature around the first fin.

19. The method of claim 16, wherein the forming a plurality of semiconductor nanosheets comprises:
    forming a plurality of first layers interposed by a plurality of second layers on first portion of the semiconductor substrate;
    laterally removing portions of the plurality of first layers to form a plurality of cavities;
    forming inner spacers in the plurality of cavities; and
    removing the first layers,
    wherein the selectively etching process is performed to further remove a residue on the first finem and the residue is formed during the forming inner spacers.

20. The method of claim 16, further comprising:
    forming a sacrificial gate structure on the first fin and the second fin; and
    replace the sacrificial gate structure by forming the gate structure.

* * * * *